(12) United States Patent  (10) Patent No.: US 7,872,417 B2
Nakamura et al.  (45) Date of Patent: Jan. 18, 2011

(54) GLASS-SEALED LIGHT EMITTING ELEMENT, CIRCUIT BOARD WITH THE GLASS-SEALED LIGHT EMITTING ELEMENT, AND METHODS FOR MANUFACTURING THOSE

(75) Inventors: Nobuhiro Nakamura, Yokohama (JP); Syuji Matsumoto, Yokohama (JP); Hitoshi Onoda, Yokohama (JP); Yutaka Segawa, Yokohama (JP); Tetsuro Matsumoto, Yokohama (JP); Hiroshi Usui, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 309 days.

(21) Appl. No.: 11/870,714

(22) Filed: Oct. 11, 2007

(65) Prior Publication Data

US 2008/0136326 A1  Jun. 12, 2008

Related U.S. Application Data

(63) Continuation of application No. PCT/JP2006/307982, filed on Apr. 14, 2006.

(30) Foreign Application Priority Data

Apr. 15, 2005 (JP) ............................. 2005-118415
Nov. 7, 2005 (JP) ............................. 2005-322943

(51) Int. Cl.
 *H01J 1/62* (2006.01)
 *H01L 33/00* (2010.01)
(52) U.S. Cl. .................. 313/512; 257/100; 362/311.05

(58) Field of Classification Search ................. 313/512; 362/223, 311.01, 311.02, 311.05, 311.06, 362/311.08; 257/100
See application file for complete search history.

(56) References Cited

U.S. PATENT DOCUMENTS 3,834,883 A * 9/1974 Klein .......................... 313/512
4,018,613 A * 4/1977 Martin ................ 257/E23.118
4,301,461 A * 11/1981 Asano .......................... 257/98
7,265,486 B2   9/2007 Yoko et al.

(Continued)

FOREIGN PATENT DOCUMENTS

JP          52-4175 A          1/1977

(Continued)

OTHER PUBLICATIONS

U.S. Appl. No. 12/258,018, filed Oct. 24, 2008, Nakamura et al.

(Continued)

*Primary Examiner*—Peter Macchiarolo
(74) *Attorney, Agent, or Firm*—Oblon, Spivak, McClelland, Maier & Neustadt, L.L.P.

(57) ABSTRACT

A diode chip is sealed by a glass material.

There are provided a light emitting diode chip and a glass member in close contact with at least one portion of the surface of the light emitting diode chip. The glass member has a surface shape containing a curved surface at least a portion thereof. The curved surface is preferably a portion of a spherical surface or a spheroidal surface. The glass member has a surface shape containing a spherical portion and a flat portion, and the diode chip is preferably disposed on the flat portion.

13 Claims, 16 Drawing Sheets

U.S. PATENT DOCUMENTS

| | | |
|---|---|---|
| 2004/0227149 A1 | 11/2004 | Ibbetson et al. |
| 2004/0257797 A1 | 12/2004 | Suehiro et al. |
| 2006/0231737 A1 | 10/2006 | Matsumoto et al. |
| 2006/0261364 A1 | 11/2006 | Suehiro et al. |
| 2009/0309125 A1* | 12/2009 | Matsumoto et al. ......... 257/100 |
| 2010/0102344 A1* | 4/2010 | Ueji ............................ 257/98 |

FOREIGN PATENT DOCUMENTS

| | | |
|---|---|---|
| JP | 07330372 A * | 12/1995 |
| JP | 3366586 | 11/2002 |
| JP | 2003-17756 A | 1/2003 |
| JP | 2003-258308 | 9/2003 |
| JP | 2005-011933 | 1/2005 |
| JP | 2005-11933 A | 1/2005 |
| JP | 2005-11953 A | 1/2005 |
| JP | 2005-39122 A | 2/2005 |
| JP | 2006-54210 | 2/2006 |
| WO | WO 2004/082036 A1 | 9/2004 |
| WO | WO 2004/100279 A2 | 11/2004 |

OTHER PUBLICATIONS

U.S. Appl. No. 12/273,194, filed Nov. 18, 2008, Nakamura et al.
U.S. Appl. No. 12/385,351, filed Apr. 6, 2009, Nakamura et al.
U.S. Appl. No. 12/536,538, filed Aug. 6, 2009, Matsumoto et al.

* cited by examiner (a)

(b)

(c)

GLASS-SEALED LIGHT EMITTING ELEMENT, CIRCUIT BOARD WITH THE GLASS-SEALED LIGHT EMITTING ELEMENT, AND METHODS FOR MANUFACTURING THOSE

BACKGROUND OF THE INVENTION

1. Field of the Invention

The present invention relates to a glass-sealed light emitting element, a circuit board with the glass-sealed light emitting element, a method for manufacturing the glass-sealed light emitting element, and a method for mounting the glass-sealed light emitting element.

2. Discussion of Background

A light source using a light emitting diode (hereinbelow, referred to as LED lamp) is a small and highly efficient light source. The LED lamp is highly reliable since there is no danger of blowout for example. Blue light emitting diodes have been recently developed. A light source for a full-color display can be fabricated by combining blue light emitting diodes and conventional green and red light emitting diodes.

On the other hand, there has been disclosed a method for obtaining white light emission by combining blue light emission and a color conversion material (see Patent Document 1 identified below). White LED lamps obtained by this method have been utilized as the backlights of cellular phones.

FIG. 20 is a cross-sectional view of a conventional LED lamp. A light emitting diode chip 101 is connected to electrodes 102 and 103 by bonding wires 104 and is molded by a resin 105. The resin mold functions to protect the light emitting diode and to control the directivity of emission light. When the resin mold is formed in a shell-shaped resin seal structure, the resin mold has a spherical surface on a leading edge thereof. The directivity of emission light is controlled by adjusting the distance between the light emitting diode and the spherical surface as well as the radius of curvature of the spherical surface. Meanwhile, light emitting diodes have been developed so as to have a short wavelength and a higher luminance.

With respect to having a short wavelength, an attempt has been made to allow light emitting diodes to emit light in the ultraviolet region. By combining such light emitting diodes with color conversion materials for red, blue and green, it is possible to obtain ultraviolet light having good color reproducibility. If a single light emitting diode can achieve to have a high luminance, it is sufficient to use a small number of light emitting diode chips in order to obtain a certain amount of light. Such light emitting diode chips can be used as a light source even in a case where external light is strong as in an outdoor place.

However, there has been a problem in terms of the degradation of a sealing resin used in a light emitting diode. Epoxy resins, which have been conventionally used, are more likely to be decomposed by blue light or ultraviolet light. Transparent resins have discolored to brown, with the result that the amount of emission light is decreased. This is because when an epoxy resin having an epoxy ring with oxygen is exposed to the ultraviolet light, the ring is opened to change in a structure having an absorption property in the visible light region. For recent years, silicone resins have been widely used. The silicone resins can improve the degree of discoloration in comparison with epoxy resins. However, even the silicone resins are subjected to a decrease in the amount of emission light caused by discoloration.

In particular, the decrease has caused a serious problem in light emitting diodes having a short wavelength and a high luminance.

Further, the refractive index of conventional sealing resins is 1.4 to 1.6 while the refractive index of the films and a substrate forming a light emitting diode is as high as 2.4 to 2.5. The light that goes out of a light emitting diode is reflected on a resin interface by the difference in the refractive indexes. For this reason, the light out-coupling efficiency is low.

Furthermore, the conventional sealing resins have a low thermal conductivity, resulting in a poor heat resistance and discoloration due to a temperature increase, and consequently luminance degradation. On the other hand, glass materials are so excellent in light resistance that they are hardly to be degraded by ultraviolet light or blue light. It is possible to produce glass having a high refractive index and a high thermal conductivity by selecting a suitable material composition.

In other words, if a light emitting diode can be sealed by a glass material, it is possible to improve the light out-coupling efficiency and to decrease the problems of the degradation and the heat dissipation of emission light. An example of a molding member made of glass for a light emitting diode is disclosed in Patent Document 2 identified below. In this reference, a glass material is recited as a color conversion member for a light emitting diode, and the glass material comprises one for a window. In this case, since emission light from a light emitting diode directly goes into a medium having a low refractive index of 1, such as air or nitrogen, once, the component reflected by an interface occupies a large part of the emission light, significantly reducing the light out-coupling efficiency. In addition, there remains the problem of heat resistance.

On the other hand, there has been known a technique of sealing GaN based LED element by glass (see Patent Document 3 identified below). An example of this technique is shown in FIG. 21 and FIG. 22. The structure of the example is as follows:

"As shown this figure, a light emitting element 1010 is fixed onto a mount lead 1021 as electric power receiving and supplying means. The bonding wire 1023, is extended between the upper electrodes in the light emitting element 1010 and a mount lead 1021. The bonding wire 1024 is extended between the upper electrodes in the light emitting element 1010 and a sublead 1022 as other electric power receiving and supplying means. As shown in FIG. 22, a cylindrical body 1058a made of low melting glass is provided and put on an assembly 1020 of a light emitting element 1010 and lead parts 1021, 1022. This is placed in an oven to soften the cylindrical body 1058a. As a result, the cylindrical body 1058a covers, in a lens form by the surface tension of the material, the assembly 1020."

However, since the light emitting element 1010 and the bonding wires 1023, 1024 are all covered with low melting glass in Patent Document 3, there is a possibility that a bonding wire breaks. The sealing member 1058 referred to this reference is likely to be formed in a oval shape since the viscosity of low melting glass is abruptly changed by a temperature change in general. From this point of view, it is supposed that it is difficult to sufficiently increase the directivity of emission light from the light emitting element 1010.

Patent Document 4 identified below discloses a light emitting device, which is capable of avoiding the deformation and the shift of bumps for a light emitting element, and the short circuit between the bumps, which are caused by applying, e.g., a pressure to the light emitting element from a sealing member during sealing.

On the other hand, the inventors have proposed a light emitting device, which is sealed by glass containing $TeO_2$ and ZnO as main components (see Patent Document 5 identified below). In this case, the LED has an average linear expansion coefficient of $85 \times 10^{-7}/°$ C. while the glass has an average linear expansion coefficient of from $75 \times 10^{-7}$ to $140 \times 10^{-7}/°$ C. Accordingly, it is expected that the residual stress caused after glass-sealing is lower than the one in Patent Document 3. From this point of view, in accordance with the glass disclosed in Patent Document 5, it is possible to reduce the danger of breakage caused by a stress without forming a stress-relaxing portion in a LED as disclosed in Patent Document 3.

Patent Document 1: Japanese Patent No. 3366586
Patent Document 2: JP-A-2003-258308
Patent Document 3: WO-A-2004/082036 Pamphlet
Patent Document 4: JP-A-2006-54210
Patent Document 5: JP-A-2005-11933

SUMMARY OF THE INVENTION

The present invention is proposed in consideration of the above-mentioned problems. Specifically, an object of the present invention is to provide a glass-sealed light emitting element, which is capable of improving the directivity of emission light.

Another object of the present invention is to provide a circuit board with the glass-sealed light emitting element, which is capable of reducing breakage and improving the directivity of emission light, a method for manufacturing the glass-sealed light emitting element, and a method for mounting the glass-sealed light emitting element.

Other objects and advantages of the present invention will appear from the following description.

According to a first aspect of the present invention, there is provided a glass-sealed light emitting element comprising a light emitting element; and a glass member for sealing the light emitting element; wherein the glass member has an upper surface shape formed by a curved surface and a lower surface shape containing a curved surface at least a portion thereof; and wherein the light emitting element has a terminal-side surface at least partially exposed from the glass member.

In the first aspect of the present invention, it is preferred that the lower surface shape of the glass member contain a flat portion; and that the light emitting element be disposed on the flat portion.

In the first aspect of the present invention, it is preferred that in a case where a portion of the surface shape with the curved surface formed thereon has a diameter A along a principal axis extending in a horizontal direction with respect to the terminal-side surface of the light emitting element, a diameter B along a principal axis extending in a vertical direction with respect to the terminal-side surface of the light emitting element, and a portion of the surface shape with the flat portion formed thereon have a diameter C; the diameters A, B and C satisfy the formula of A>B>C. It is further preferred that the formula of $(C/A) \leq 0.6$ be established.

It is preferred that the light emitting element comprise a semiconductor chip formed in a rectangular shape as viewed in a front view; and that a portion of the glass member with the curved surface formed thereon have a radius of curvature having a length at least 2.5 times a length of one side of the semiconductor chip. It is preferred that the curved surface be a portion of a spherical surface or a spheroidal surface. The light emitting element may comprise a LED or a semiconductor laser. It is preferred that the glass member contain $TeO_2$, $B_2O_3$ and ZnO. It is preferred that in a case where the light emitting element includes a semiconductor substrate having a thermal expansion coefficient $\alpha_1$, and the glass member has a thermal expansion coefficient $\alpha_2$; the thermal expansion coefficient $\alpha_1$ and the thermal expansion coefficient $\alpha_2$ satisfy the formula of $|\alpha_1-\alpha_2|<20\times10^{-7}$ (° C.$^{-1}$). It is further preferred that the formula of $|\alpha_1-\alpha_2|<15\times10^{-7}$ (° C.$^{-1}$) be established. It is preferred that the glass member have a refractive index of 1.7 or above.

According to a second aspect of the present invention, there is provided a circuit board with a glass-sealed light emitting element, comprising the above-mentioned light emitting element; and a substrate electrically connected to terminals of the light emitting element.

According to a third aspect of the present invention, there is provided a method for fabricating a glass-sealed light emitting element, comprising putting a solid glass member on a light emitting element; heating the glass member and the light emitting element to melt the solid glass member so as to bring contact portions of the glass member and the light emitting element into close contact with each other; and annealing the molten glass member and light emitting element. In the third aspect, it is preferred that the method further comprise putting the light emitting element on a surface coated with a releasing agent having a low wettability with respect to molten glass.

In the third aspect of the present invention, it is preferred that the method further comprise using a jig including a recessed portion for putting the light emitting element therein; and putting the light emitting element and the glass member in the recessed portion, followed by heating the light emitting element and the glass member to form the glass member in a shape by use of an inner shape of the recessed portion.

The method may further comprise forming the glass member so that discoloring materials are scattered in the vicinity of the light emitting element, and then using a glass member containing no discoloring materials to cover the glass member containing the scattered discoloring materials. It is preferred that the method comprise heating the light emitting element to a maximum temperature, which is higher than a softening point of the glass member by 80 to 150° C. It is further preferred that the maximum temperature be higher than the softening point of the glass member by 110 to 150° C.

In the present invention, the softening point was measured by a simple method having a measurement accuracy of ±15° C. The measurement was performed as follows. Samples, which were processed in a cylindrical shape having a diameter of 5 mm and a length of 20 mm, were measured by a thermal mechanical analyzer manufactured by MAC-SCIENCE and available under the product name "DILATOMETER". By the measurement, temperatures (yield points), at which detection portions of the samples to detect elongation cannot be further pressed because of the softening of the samples, were sought with the pressure applied to the detection portions being set at 4.9 KPa (a applied load of 10 g) and the temperature raising rate being set of 5° C./min, and the sought temperatures were determined as softening points.

For example, in the case of a glass member containing TeO2 stated later, it is possible to obtain a maximum reached temperature of 600 to 620° C. by heating. The glass member containing TeO02 can be adapted to treatment at a temperature in the vicinity of 560 to 570° C. in a lower temperature range than the examples stated later, by adjusting the composition of the glass member.

It is preferred that in a case where the light emitting element includes a semiconductor substrate having a thermal expansion coefficient $\alpha_1$, and the glass member has a thermal expansion coefficient $\alpha_2$; the thermal expansion coefficient $\alpha_1$ and the thermal expansion coefficient $\alpha_2$ satisfy the formula of $|\alpha_1-\alpha_2|<20\times10^{-7}$ (° C.$^{-1}$). It is further preferred that the formula of $|\alpha_1-\alpha_2|<15\times10^{-7}$ (° C.$^{-1}$) be established. The light emitting element may comprise a LED or a semiconductor laser.

According to a fourth aspect of the present invention, there is provided a method for mounting the above-mentioned light emitting element to a board with wiring. In the fourth aspect, in a case where the light emitting element includes a semiconductor substrate, a light emitting portion formed on a principal side of the semiconductor substrate and terminals for supplying power to the light emitting portion, the method may further comprises sealing the light emitting element by a glass member; forming bumps on both terminals of a p side and an n side of the light emitting element; and electrically connecting the bumps and the wiring of the board with wiring. The light emitting element may comprise a LED or a semiconductor laser.

In accordance with the present invention, it is possible to use, as the sealing material for a light emitting diode, a glass material, which is excellent in light resistance.

Thus, it is possible to control the directivity of emission light with a light emitting element being used as a light source. By adopting a glass material, it is possible to solve the problem of, e.g., a decrease in luminance due to the discoloration of the conventional sealing resins. If glass having a high refractive index is used, it is possible to improve the efficiency of taking light out of a light emitting element.

Further, since glass materials have a better thermal conductivity than resins, it is possible to improve the heat dissipation that has been a problem of, in particular, high luminance LEDs. When color conversion materials are dispersed in glass, it is possible not only to mix an emission color and a converted color to obtain a desired color but also to improve the heat dissipation as an electronic device. As stated above, it is possible to fabricate a light emitting element sealed by glass, which is excellent in at least one of light resistance, light out-coupling efficiency and heat dissipation. Further, it is possible to control the directivity of emission light by forming a light emitting element in a certain curved shape.

DETAILED DESCRIPTION OF THE PREFERRED EMBODIMENTS

Now, embodiments of the present invention will described in reference to the accompanying drawings.

Figure 1:
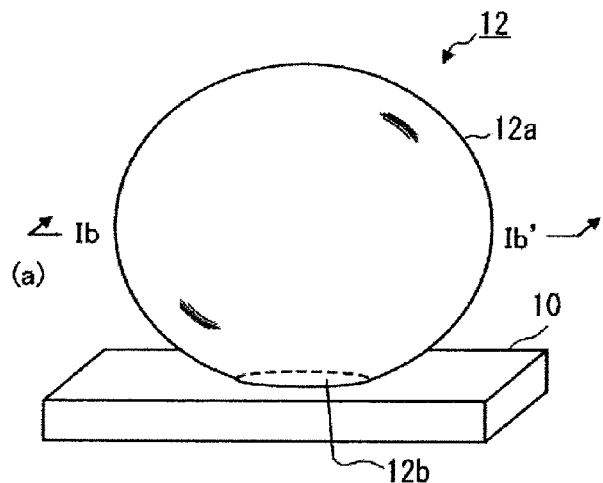
FIGS. 1(a) and (b) are a perspective view showing the glass member according to an embodiment of the present invention and a cross-sectional view taking along line Ib-Ib' of FIG. 1(a)

FIG. 1(a) is a perspective view showing the glass member according to an embodiment of the present invention, and FIG. 1(b) is a cross-sectional view taken along line Ib-Ib' of FIG. 1(a). In accordance with the present invention, a glass member 12 as shown in, e.g., FIG. 1(a) is brought into close contact with at least one portion of a semiconductor light emitting diode chip. By adopting this structure, it is possible to provide a glass-sealed light emitting element, which is excellent in light resistance and light out-coupling efficiency.

The light emitting element may comprise a light emitting diode chip, a semiconductor laser diode chip or the like. It is preferred that the light emitting element be not degraded by the heat treatment performed when melting the glass member. A light emitting diode or a semiconductor laser diode, which emits blue light, is preferably used since the heat resistance generally increases as the bandgap increases. For example, it is possible to use a light emitting diode or a semiconductor laser diode, the emission light of which has a main peak wavelength of 500 nm or below, more specifically, a light emitting diode or a semiconductor laser diode, which comprises a nitride compound semiconductor, such as GaN or InGaN, or comprises a II-VI family semiconductor, such as ZnO or ZnS. The glass member 12 is made of a material having a refractive index of 1.7 or above (preferably 1.7 to 2.0, more preferably 1.7 to 1.8). It is preferred from the viewpoint of increasing the efficiency of taking light out of the light emitting diode chip into the glass member and increasing the directivity of emission light that the glass member has a higher refractive index.

It is preferred that the glass member 12 have a softening point of 500° C. or below, an average linear expansion coefficient of from $65 \times 10^{-7}$ to $95 \times 10^{-7}$/° C. at temperature having a range from 50 to 300° C., an internal transmittance of 80% or above with a thickness of 1 mm for light having a wavelength of 405 nm and a refractive index of 1.7 or above for the same light. Since such glass has a high refractive index and is only slightly different from a substrate 10 in terms of coefficient of thermal expansion, it is possible to cover a light emitting diode chip 11 without reducing the light out-coupling efficiency. Specifically, glass containing $TeO_2$, $B_2O_3$ and ZnO is preferably used. In particular, it is preferred that the content of $TeO_2$ be 10 mol % or above. As the content of $TeO_2$ increases, the refractive index increases.

Figure 18:
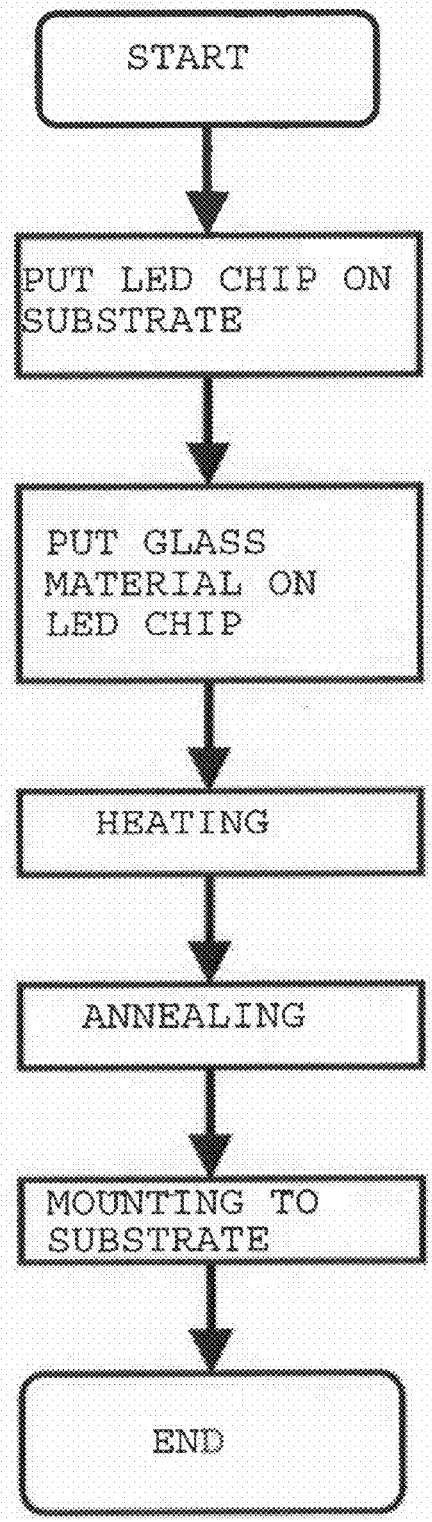
FIG. 18 is a flowchart showing the fabrication process according to another embodiment of the present invention.

Now, a first method according to the present invention will be described (see FIG. 18 showing a flowchart). First, a glass member in a block shape (strip piece) is put on an upper portion of a light emitting element, which has been put on a flat plate so as to be directed in a desired direction. After that, a heat treatment is performed (to increase the temperature of the entire atmosphere) to melt the glass member so as to cover the light emitting element with the molten glass member, and further to form the glass member so that the glass member comprises an upper surface shape formed by a curved surface and a lower surface shape containing a curved surface at least a portion thereof. Then, the heat treatment is stopped to move to an annealing step. Finally, the glass member is solidified, obtaining a desired glass-sealed light emitting element. Even if a slight amount of glass has adhered to a portion of a surface of the light emitting element with terminals formed thereon, no problem occurs as long as the electric drive and the light emission operation of the light emitting element are not hindered.

In this case, it is preferred that the principal surface of the glass member in a block shape be preliminarily mirror-finished to prevent unnecessary bubbles from being formed when the glass member is molten. It is also preferred to fabricate or select the glass member in a block shape having desired dimensions and weight.

By properly adjusting the relationship between the volume of the glass member and the size of the light emitting element, and forming the molten glass member in a substantially spherical shape on the upper portion of the light emitting element while the glass member is brought into contact with the light emitting element, followed by annealing, it is also possible to obtain a glass-sealed light emitting element, which is formed in such a shape that the glass member is brought into contact with the flat plate at the lower leading edge, that the light emitting element is slightly embedded in a surface of the glass member, and that the area of the flat portion is reduced.

Next, a second method according to the present invention, wherein a glass member having a certain shape (preform) is preliminarily formed and used, will be described. The glass member has such a structure which comprises an upper surface shape having a curved surface and a lower surface shape containing a curved surface and a flat surface.

The second method is performed by putting a glass material on a flat plate having mold releasability, followed by heating and melting the glass material. The flat plate having mold releasability may comprise a flat plate having a release agent layer formed thereon or a flat plate made of a material having mold releasability. Examples of the material having mold releasability include boron nitride and carbon (in particular, glassy carbon). If carbon is used, it is necessary to make the treatment under vacuum or in an atmosphere of an inert gas, such as nitrogen.

In the present invention, the flat surface portion on the surface shape of the glass member is formed at a portion of the glass member in contact with the flat plate. Accordingly, the flat surface portion is formed in such shape to substantially follow the surface shape of the flat plate. It should be noted that the flat surface portion corresponds to a flat surface 12b shown in FIG. 1.

For example, on a substrate (made of, e.g., alumina) 10 covered with a release agent (material having a low wettability with respect to molten glass), a glass material in a solid or paste form is heated to be molten and is put in such a state that at least one portion of the surface shape is made in a curved shape, preferably in a substantial spherical shape by the surface tension of the glass material per se. Then, the molten glass is annealed in that state, and the formed shape is fixed, forming the glass member.

When the glass member is relatively larger than the light emitting element, the glass member is more affected by gravity than the cohesion force. Accordingly, in an example stated later, the surface shape of the cohered glass member 12 is formed by a surface 12a approximate to a curved surface body, such as a spheroid, and the flat surface 12b in contact with the substrate 10. The surface 12a corresponds to the curved portion of the surface shape of the glass member 12. The surface 12b corresponds to the flat portion of the surface shape of the glass member 12.

The glass member 12 is determined to have a shape defined by three parameters of a diameter A along the principal axis extending in a horizontal direction with respect to the substrate 10 in the surface 12a and a diameter B along the principal axis extending in a vertical direction with respect to the substrate 10 in the surface 12a, and a diameter C of the surface 12b. The principal axis extending in a horizontal direction defines an upper region 121 of the glass member and a lower region 122 of the glass member. Since the light emitting diode chip is put on the substrate 10 and is sealed by the glass member 12, having a terminal-side surface faced downward, as stated later, the "horizontal direction with respect to the substrate 10 in the surface 12a" may be restated as "the horizontal direction with respect to the terminal-side surface of the light emitting diode chip". A similar restatement may be applied to the vertical direction with the necessary modification.

Between the diameters A, B and C, the following relationship is established.

$A > B > C$

In the present invention, it is preferred that the curved surface form a portion of a spherical or spheroidal surface. From the viewpoint that the directivity of emission light increases as the shape of the glass member 12 is closer to a spherical shape, it is preferred that the following relationship be established.

$(C/A) \leq 0.6$

Since the light emitting diode chip, on which the glass member 12 is put, has dimensions of about 0.3 mm□ as viewed in a front view and is extremely minute, the glass member 12 may be minute and light weight. For this reason, the shape of the surface 12a is substantially approximate to a spherical surface. When a light emitting diode bare chip is much smaller than the glass sphere, the LED covered with the glass has an excellent directivity of emission light because of being approximated as a point source. From this point of view, it is preferred that the radius of curvature of a spherical surface portion of the glass member be 2.5 times or above the length of one side of the light emitting diode chip. In other words, it is preferred that the following relationship be established with respect to the diameter A.

$(A/2) \geq 2.5$

It should be noted that glass tends to be formed in a shape (spherical shape) defined by the surface energy thereof and the wettability of a substrate at a certain temperature. In fact, the final shape, i.e., the shape obtained at equilibrium is additionally determined by affection of deformation caused by the weight of the glass. The surface of a glass member has a shape closer to a spherical surface as the weight of the glass material decreases. On the other hand, the surface of a glass member has a shape closer to an oval shape as the weight of the glass material increases. From the viewpoint that the directivity of emission light increases as the shape of a glass member is closer to a spherical shape, it is preferred that the weight of the glass material is lower. In the present invention, it is acceptable to use a glass member which finally has a diameter A of no more than about 1 cm. Basically, it is possible to have the glass member having a substantially spherical shape. If the degree of deformation is great, it is supposed that the glass member is formed in a spheroidal shape.

Next, the structure and the like of the glass-sealed light emitting diode chip according to the present invention will be described.

Figure 2:
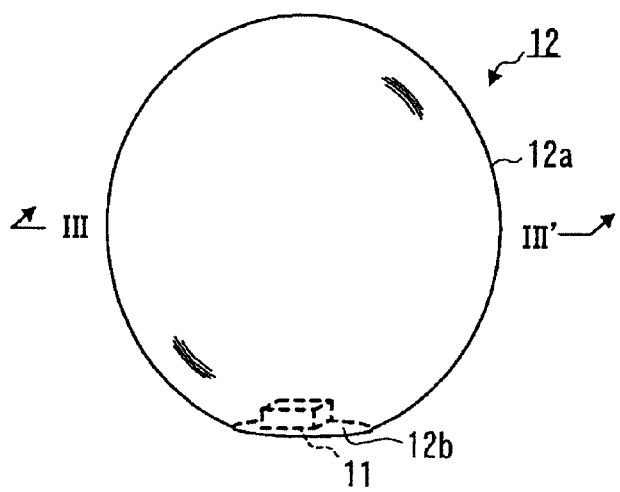
FIG. 2 is a perspective view showing the glass-sealed light emitting diode chip according to an embodiment of the present invention.
Figure 3:
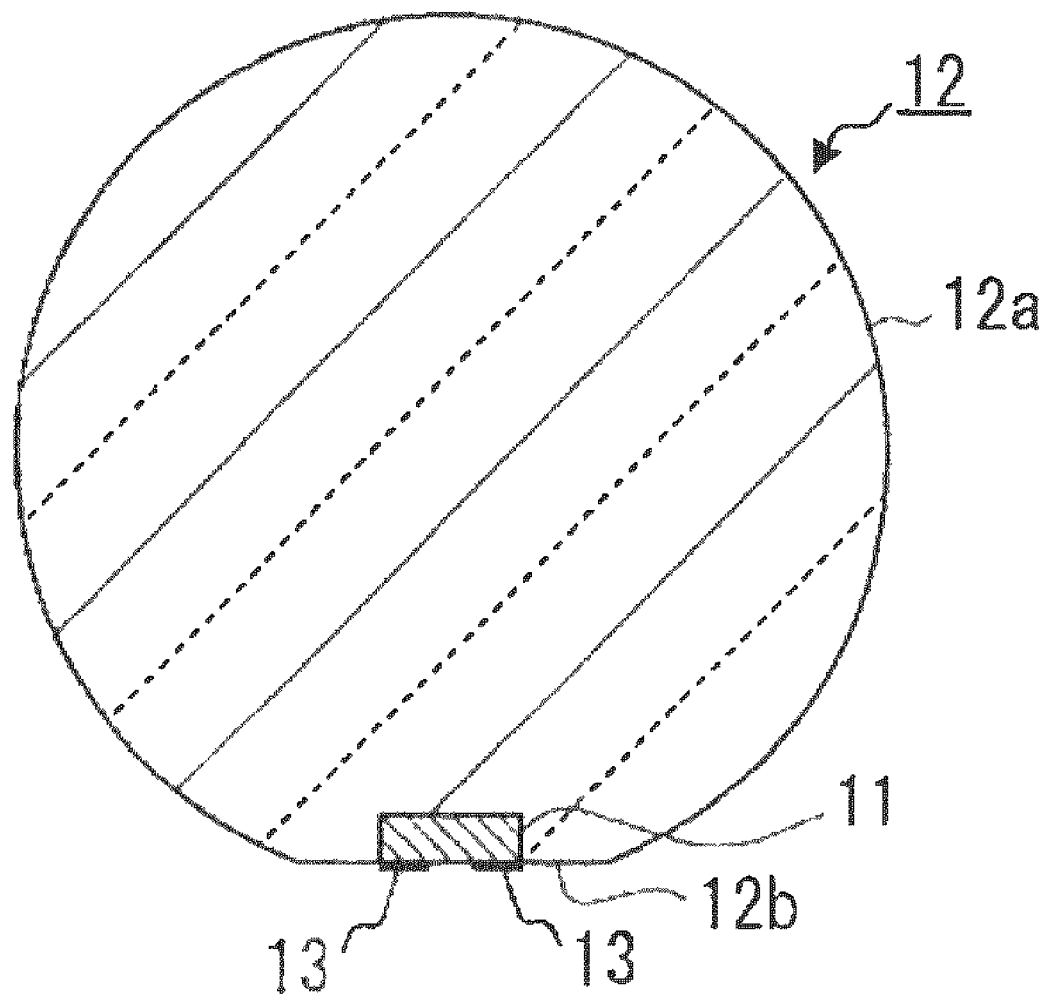
FIG. 3 is a cross-sectional view taking along line III-III' of FIG. 2.

FIG. 2 is a perspective view showing the glass-sealed light emitting diode chip according to an embodiment of the present invention, and FIG. 3 is a cross-sectional view taken along line III-III' of FIG. 2. The glass member 12 shown in these figures is similar to the one shown in FIG. 1(a), and a light emitting diode chip 11 is disposed in a flat surface 12b.

As shown in these figures, the light emitting diode chip 11 is put on a substrate 10 coated with a releasing agent, having terminals 13 facing the substrate 10. Next, the glass member 12 as shown in FIG. 1(a) is put on the light emitting diode chip 11 and the glass member 12 in a solid state is softened by heating. As a result, the glass member 12 is shifted downward by gravity, with the result that the light emitting diode chip 11 is surrounded by the glass member. In the meantime, the light emitting diode chip 11 is shifted upward in the glass member 12 by buoyancy since the light emitting diode chip 11 has a lower specific gravity than the glass member 12. The distance of shift r is represented by the following formula, where F is a buoyancy, t is a time period required for softening glass, and η is a glass viscosity.

$r \propto F \times t \times \eta^{-1}$

The buoyancy is determined by the difference between the specific gravity of the glass and the specific gravity of the light emitting diode chip. Since the most part of the weight of the light emitting diode chip is occupied by the substrate, it is supposed that the specific gravity of the light emitting diode chip can be approximated by the specific gravity of the substrate. For example, the substrate used for a general light emitting diode chip has a specific gravity of 4.0 g/cm$^3$ for a sapphire substrate, 3.1 g/cm$^3$ for a SiC substrate and 5.3 g/cm$^3$ for a GaAs substrate. On the other hand, zinc oxide-phosphate based glass has a specific gravity of from 2.8 g/cm$^3$ to 3.3 g/cm$^3$, and zinc oxide-borosilicate based glass has a specific gravity of from 2.6 g/cm$^3$ to 3.0 g/cm$^3$. Among glass containing TeO$_2$, B$_2$O$_3$ and ZnO with the content of TeO$_2$ being 10 mol % or above, glass having a composition of TeO$_2$ (45.0%), TiO$_2$ (1.0%), GeO$_2$ (5.0%), B$_2$O$_3$ (18.0%), Ga$_2$O$_3$ (6.0%), Bi$_2$O$_3$ (3.0%), ZnO (15%), Y$_2$O$_3$ (0.5%), La$_2$O$_3$ (0.5%), Gd$_2$O$_3$ (3.0%) and Ta$_2$O$_5$ (3.0%) has a specific gravity of 5.2 g/cm$^3$.

If there is no change in connection with the light emitting diode chip 11, the distance of shift r increases as the specific gravity of glass increases. In other words, the light emitting diode chip 11 is more deeply embedded into the glass member 12 as the specific gravity of the glass increases. Since the space that occupies between the light emitting diode chip 11 and the substrate coated with a releasing agent increases in this case, the air that has been confined between the substrate and the glass member 12 is allowed to escape into this space when covering the light emitting diode chip 11 with the glass member 12. Thus, it is possible to prevent bubbles from being formed in the glass member 12.

This will be described in more detail, referring to FIGS. 4(a) to (c).

Figure 4:
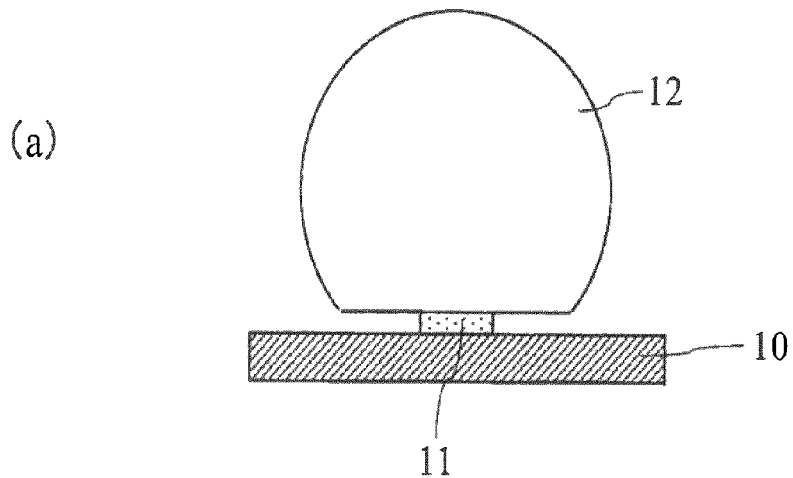
FIGS. 4(a) to (c) are schematic views showing a process for glass-sealing a light emitting diode chip.
Figure 4:
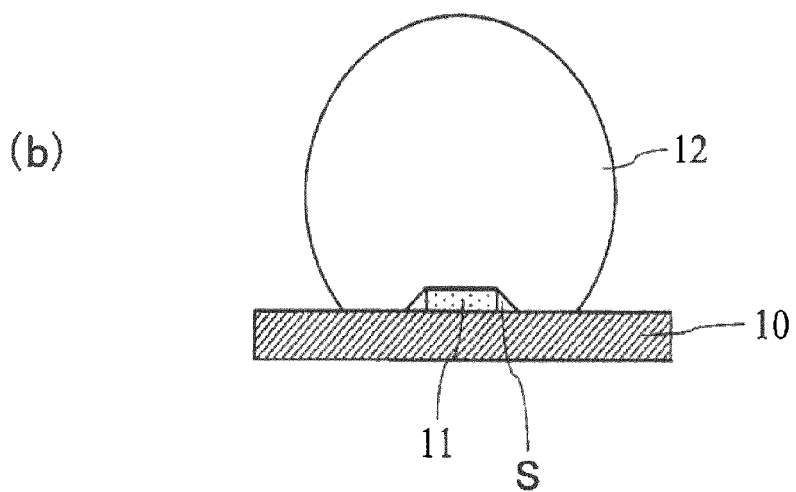
Figure 4:
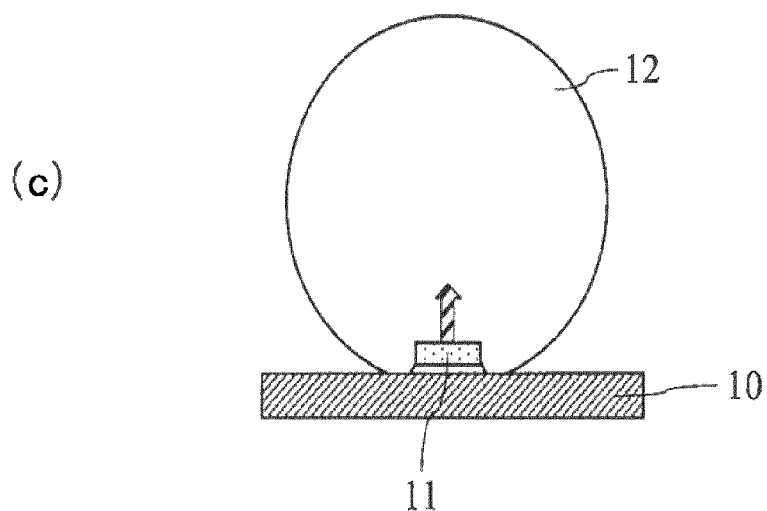

FIG. 4(a) shows a state where the glass member 12 is put on the light emitting diode chip 11 on the substrate 10 coated with a releasing agent. When the glass member 12 is softened by heating, the glass member 12 is shifted downward by gravity to form a closed space S among the glass member 12, the light emitting diode 11 and the substrate 10. When the light emitting diode chip 11 has a smaller specific gravity than the glass member 12, the light emitting diode chip 11 is shifted in the arrow direction, being embedded into the glass member 12 as shown in FIG. 4(c). At this time, it is possible to prevent bubbles from being formed in the glass member 12 since the air confined in the closed space S shifts into a portion between the light emitting diode chip 11 and the substrate 10.

It should be noted that when general glass having a low melting point (such as phosphate/tin oxide/zinc oxide based glass) is used, it is difficult to form softened glass in a spherical shape since the viscosity abruptly changes according to temperature.

When a portion of the light emitting diode chip 11 is embedded into the glass member 12 as stated above, the glass member 12 is fixed to the light-emitting surface of the light emitting diode chip 11 so as to be brought into close contact with the light emitting diode chip without forming a gap between both of the glass member and the light emitting diode chip. A large part of the light emitting diode chip 11 is embedded into the glass member 12, having only the terminal-side surface exposed. This arrangement is effective in improving the light out-coupling efficiency since not only light emission from the backside of the chip but also light emission from the end faces of the chip (the lateral surfaces of the chip when the chip is regarded as a rectangular parallelepiped) are reflected and propagated in the glass member. It should be understood that the present invention contains a mode where only the backside of the chip is sealed by the glass member, a mode where the entire backside and a portion of the end faces of the chip are embedded into the glass member, and a mode where only a portion of the backside of the chip is sealed by the glass member. The details of the fabrication method will be described when explaining examples.

Figure 5:
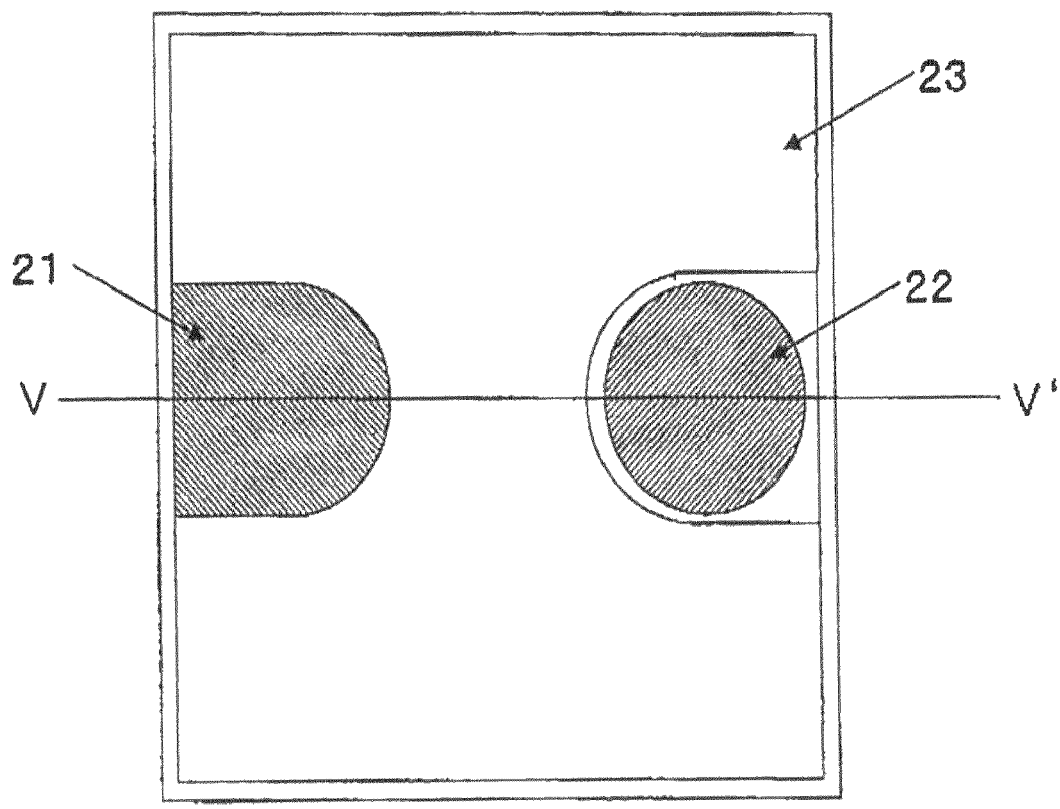
FIG. 5 is a plan view showing the light emitting diode chip according to an embodiment of the present invention.
Figure 6:
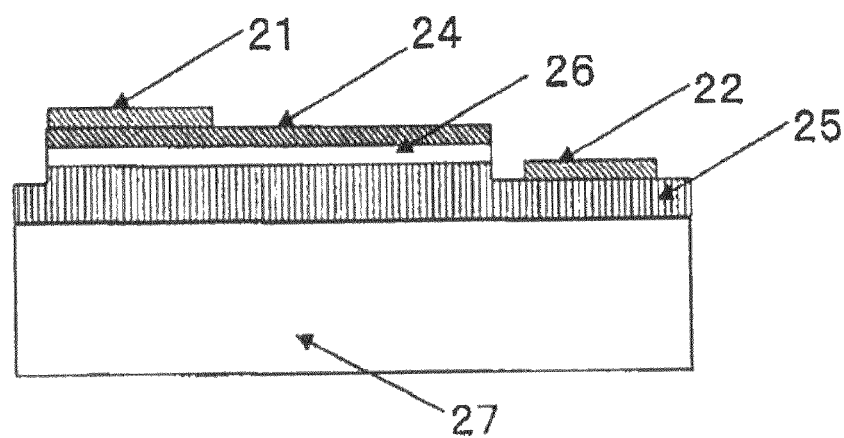
FIG. 6 is a cross-sectional view taken along V-V' of FIG. 5.

FIG. 5 is a plan view showing the light emitting diode chip according to an embodiment of the present invention, and FIG. 6 is a cross-sectional view taken along line V-V' of FIG. 5. In these figures, reference numeral 21 designates a p electrode, reference numeral 22 designates an n electrode, reference numeral 23 designates a light emitting portion, reference numeral 24 designates a p-type semiconductor layer, reference numeral 25 designates an n-type semiconductor layer, reference numeral 26 designates a light emitting layer, and reference numeral 27 designates a sapphire substrate. The light-emitting diode chip includes a semiconductor layer of InGaN formed on the sapphire substrate. The light-emitting diode chip is formed in a square shape having dimensions of 300 μm×300 μm and a thickness of 80 μm. Each of the p electrode and the n electrode has a surface made of gold. From the viewpoint of increasing the heat resistance of the light-emitting diode chip when sealing by use of glass, it is preferred to make the film thickness of gold thicker.

Figure 7:
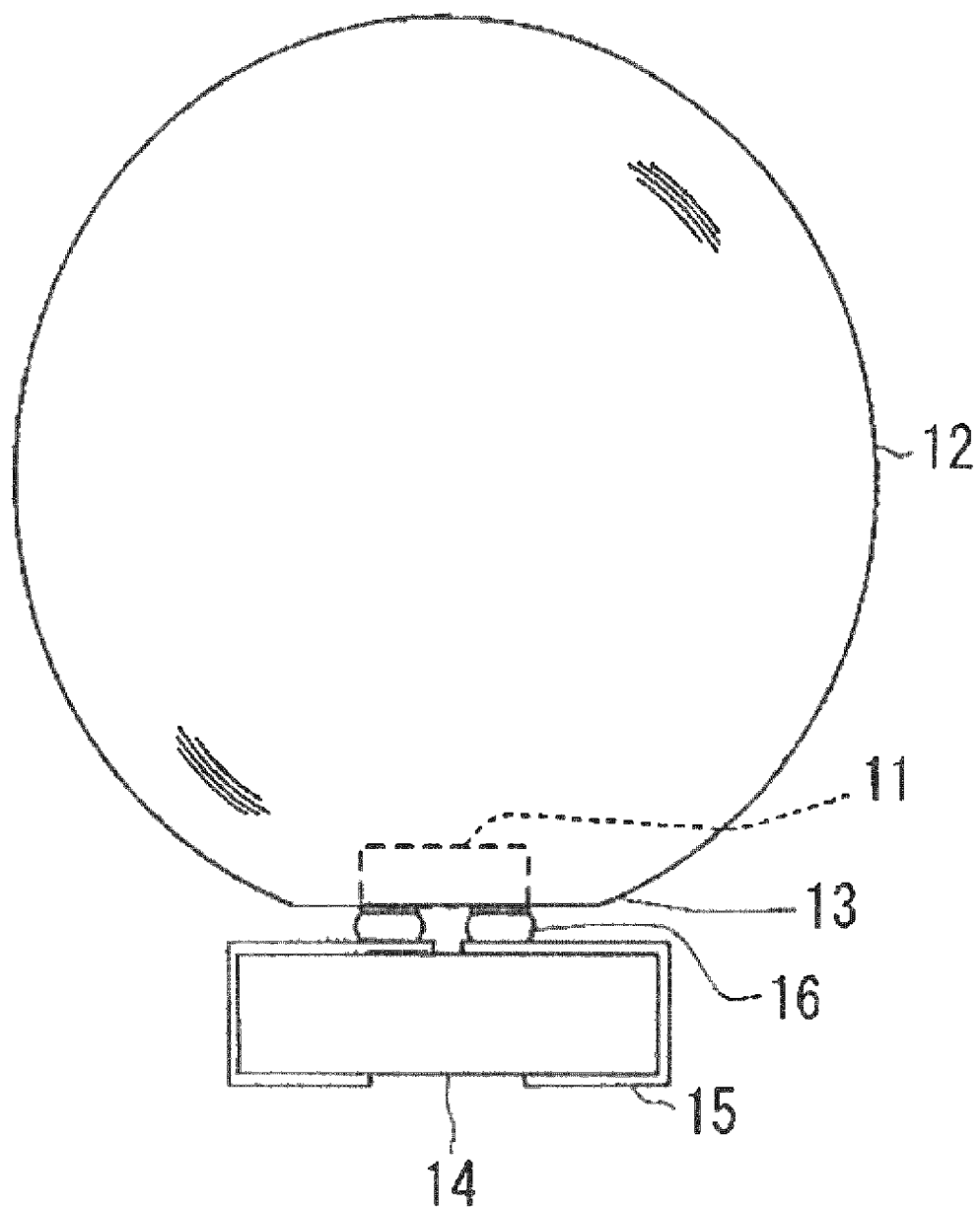
FIG. 7 is a side view showing the circuit board with a light emitting diode according to an embodiment of the present invention.

FIG. 7 is a side view of the circuit board with a light emitting diode according to an embodiment of the present invention. The glass-sealed light emitting diode chip shown in FIG. 2 can be used for various applications, such as illumination, by being mounted to a certain substrate. It is possible to use various kinds of known substrates. An example of the substrate is a glass substrate.

FIG. 7 shows a configuration example of parts. A glass epoxy substrate 14 has two electrodes 15 formed on one surface thereof for electrical connection with the terminals 13 of the chip 11, and end portions of the electrodes 15 extend onto the other surface of the substrate 14.

The respective terminals 13 of the chip 11 are flip-chip mounted on the respective electrodes 15 of the substrate 14 through solder bumps 16. In this configuration example, a glass member 12 is mounted to the chip 11, followed by mounting the chip on the substrate 14. If the light emitting diode chip 11 and other parts are mounted to the substrate 14, followed by covering the entire parts with a resin, it is possible to prevent the terminal 13 from being degraded by moisture.

In accordance with the circuit board with the glass-sealed light emitting diode according to the present invention, it is possible to obtain a larger luminous flux in comparison with the conventional resin-sealed light emitting diode chips. On the other hand, with respect to power consumption, there is a trade-off relationship between a luminous flux and power consumption since the power consumption of the light emitting diode chip according to the present invention is greater than that of the conventional resin-sealed light emitting diode chips. A degradation in the light emitting diode chip (in particular, the electrode portion) caused by heat during glass sealing is a factor in an increase in power consumption. Thus, it is expected to decrease the power consumption by using a light emitting diode chip having a high heat resistance.

EXAMPLES

Now, Example 1 to Example 6 of the present invention will be described.

Example 1

Figure 8:
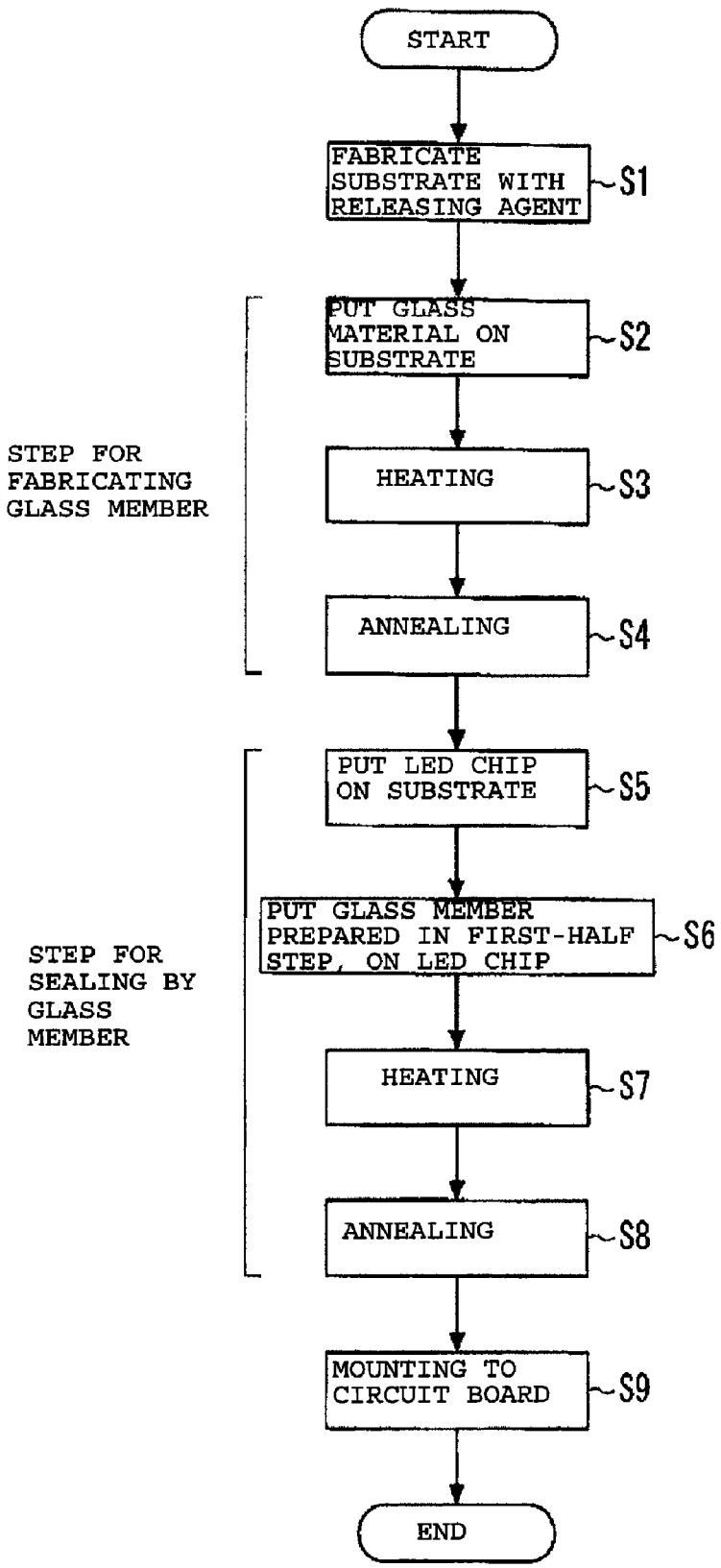
FIG. 8 is a flowchart showing a process for fabricating the glass-sealed light emitting diode chip according to the present invention and the circuit board with a light emitting diode according to the present invention.
Figure 9:
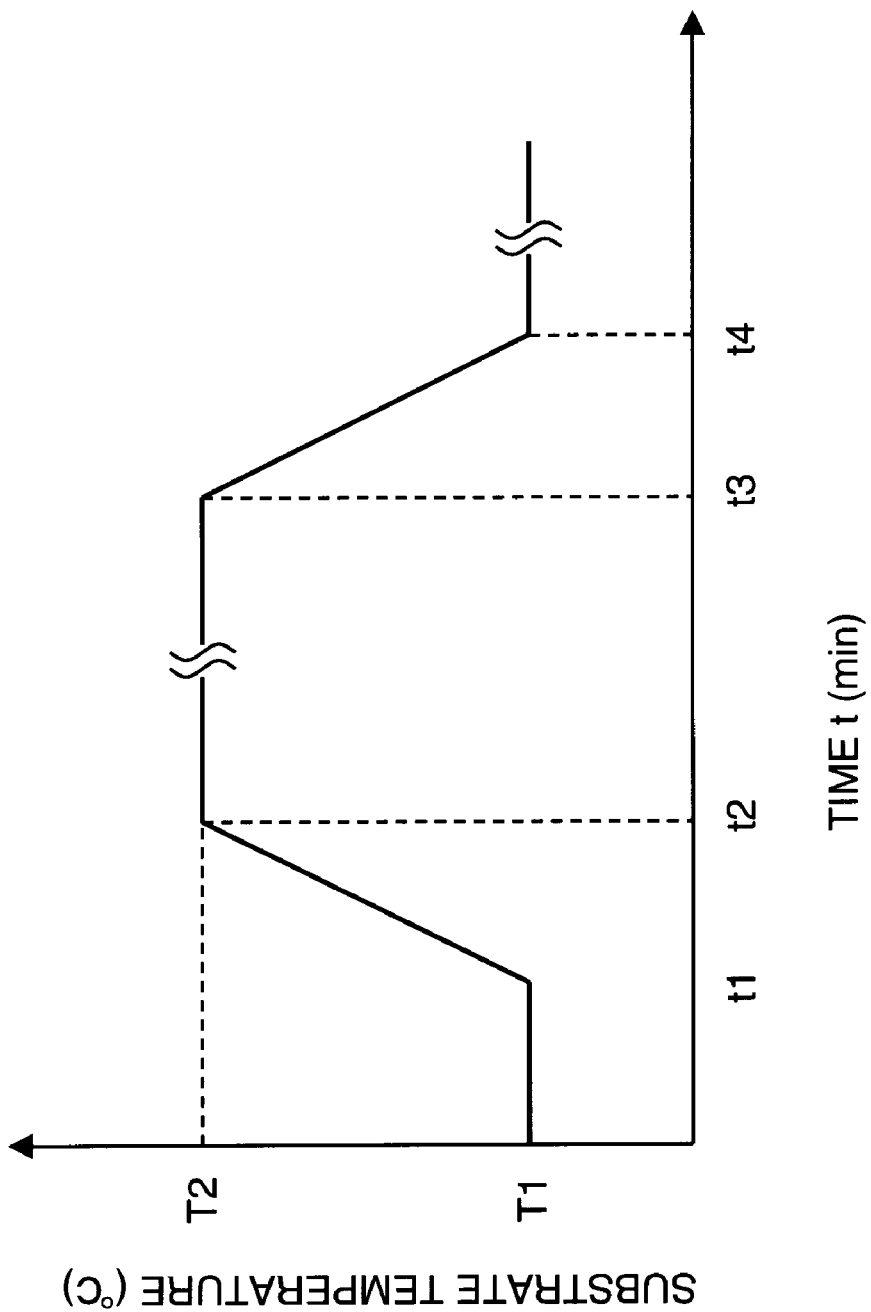
FIG. 9 is a graph showing the temperature history of a substrate in the process.

FIG. 8 is a flowchart showing an example of the fabrication process of the glass-sealed light emitting diode chip and the circuit board with the light emitting diode according to the present invention. FIG. 9 is a graph showing the history of a substrate temperature in the fabrication process.

First, a substrate with a releasing agent applied thereon was fabricated (Step S1). The substrate comprised a 6-inch silicon wafer manufactured by OSAKA TITANIUM, and boron nitride powder "Boron Spray" manufactured by KakenTech Co. Ltd. was sprayed as the releasing agent on the silicon wafer. The boron nitride powder was sprayed such that the silicon wafer surface was not seen. Next, a glass member for sealing was fabricated. The glass material for the glass member had a composition of $TeO_2$ (45.0%), $TiO_2$ (1.0%), $GeO_2$ (5.0%), $B_2O_3$ (18.0%), $Ga_2O_3$ (6.0%), $Bi_2O_3$ (3.0%), ZnO (15%), $Y_2O_3$ (0.5%), $La_2O_3$ (0.5%), $Gd_2O_3$ (3.0%) and $Ta_2O_5$ (3.0%).

The rate "%" means "mol %". The glass member used in this Example had a glass transition temperature (Tg) of 450° C. and a thermal expansion coefficient (a) of $86 \times 10^{-7}$ (° $C.^{-1}$). The glass material is softened at a relatively low temperature, and the thermal expansion coefficient of the glass material is close to that of sapphire (α=68 (parallel to C axis), 52 (vertical to C axis)) and other materials, which are used as a substrate for a light emitting diode. It is preferred that the thermal expansion coefficient $\alpha_1$ of a substrate for a light emitting diode and the thermal expansion coefficient $\alpha_2$ of a glass member satisfy the formula of $|\alpha_1-\alpha_2|<15\times10^{-7}$ (° $C.^{-1}$).

Since the refractive index of the glass material at a wavelength of 405 nm was as high as 2.01, it is supposed that the efficient of taking out light and the directivity of light from the light emitting diode chip are improved. The glass material can be preferably used as the sealing material for a light emitting element, such as an LED and a semiconductor laser, since the glass material is excellent in water resistance and acid resistance. A glass piece of the glass member in the amount of 30 mg was put on the above-mentioned substrate with a releasing agent (Step S2).

Next, the substrate with the glass piece put thereon was heated (Step S3). Heating was carried out by using a muffle furnace FP41 manufactured by Daiwa Kagaku. The substrate was heated from 25° C. to 610° C. at a temperature raising rate of 5° C./min and was maintained at that temperature for 15 minutes. Then, the substrate was gradually cooled to 25° C. at a rate of 5° C./min. (Step S4).

By this treatment, the glass material was formed in a spherical shape having a flat portion at a portion thereof in contact with the substrate as shown in FIG. 1(a). The spherical shape had a diameter of 2.0 mm (diameter A) and a height of 1.9 (diameter B). The spherical shape had a bottom surface formed in a circular shape having a diameter of 0.8 mm (diameter C). Then, diode chips were put on the substrate coated with the above-mentioned boron nitride powder (Step S5). Each of the light emitting diode chips comprised a blue light emitting chip (manufactured by Showa Denko K.K. and available in the product name of GB-3070) and had an n electrode and a p electrode disposed one side thereof. Each of the light emitting diode chips was put on the substrate such that the terminals of each of the light emitting diode chips faced a substrate surface.

Light emitting diode chips are difficult to handle because of being small. The light emitting diode chips were dispersed on the substrate from a height of 3 cm. Substantially spherical glass members thus prepared were put on light emitting diode chips having the terminal portion facing the substrate surface among the dispersed light emitting diode chips, such that the respective light emitting diode chips were disposed on the center of the bottom surfaces of the glass members. Then, the substrate with the light emitting diode chips and the glass members put thereon was put into the above-mentioned muffle furnace to be heated, followed by being cooled (Steps S7 and S8).

By mounting the above-mentioned glass-sealed light emitting diode chips to circuit boards (for example, one shown in FIG. 7) by a process independent from the above-mentioned series of steps, the circuit boards with a light emitting diode were obtained (Step S9).

It should be noted that the heating rate, the maintained temperature, the maintaining period and the cooling rate were the same as those in the fabrication of the glass members.

Although the light emitting diode chips were slightly embedded into the glass members by the heating treatment in Step S7, glass did not adhere to the electrode forming surfaces. One of the glass-sealed light emitting diode chips thus obtained is shown in FIG. 2. The dimensions of the glass members 12 were the same as the initial values of the glass members. Then, the light emitting state of the light emitting diode chips 11 sealed by the glass members 12 was verified by applying a voltage to the light emitting diode chips.

Figure 10:
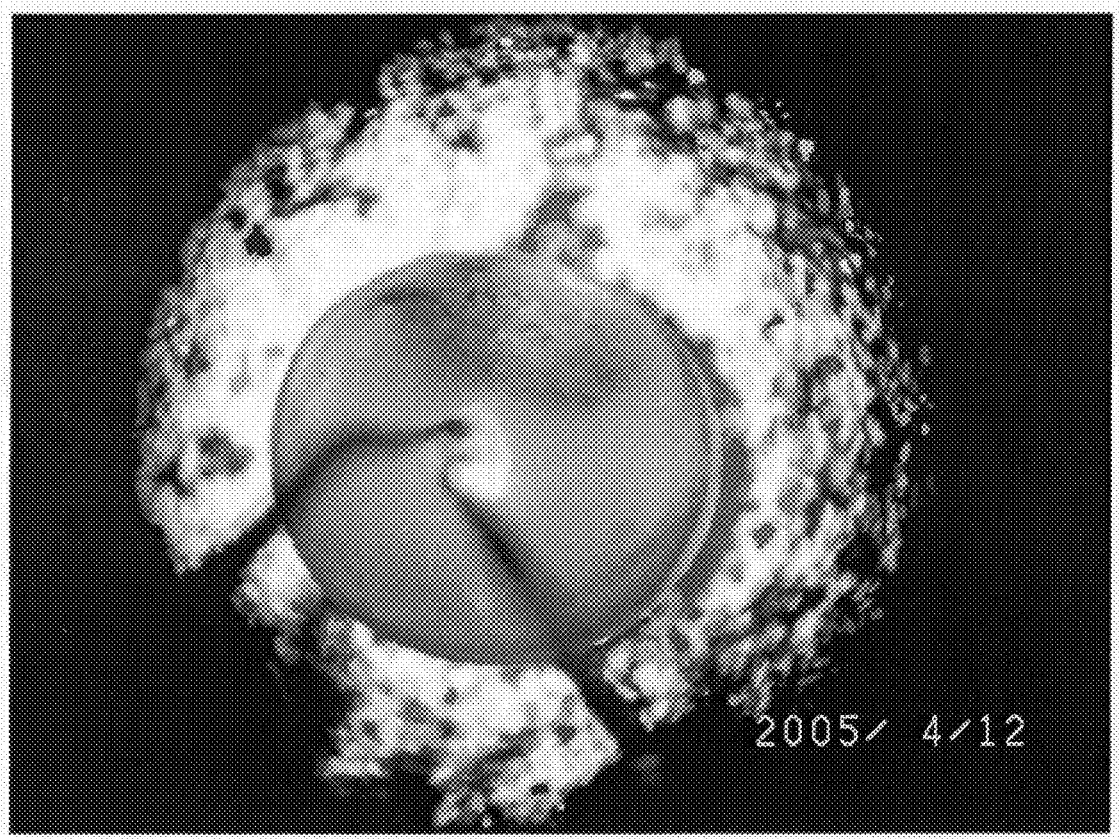
FIG. 10 is a view showing the glass-sealed light emitting diode chip according to an embodiment of the present invention.

The voltage application was made by a DC power source "MC35-1A" manufactured by KIKUSUI ELECTRONICS CORP. with the power source being connected to the terminals by use of a manual prober. The turn-on voltage was 2.5 V. The turn-on voltage means a voltage, at which light emission can be visually observed. Since the turn-on voltage of bare chips, which are not sealed by glass, is 2.3 V, the glass sealing has almost no effect on the turn-on voltage. The light emitting state at an applied voltage of 3.5 V is shown in the photograph of FIG. 10.

The spherical object that is located at a central portion of this figure is a substantially spherical glass member, and a portion that shines in white in surroundings of the glass member is a substrate coated with a releasing agent, which is illuminated with the light emission. The glass member had a light emitting diode chip fixed to the center thereof so as to be brought into close contact therewith, although it is difficult to visually recognize the fixing state in this photograph. Two black shades appeared from portions in the vicinity of the center of the glass member are electrodes electrically connected to both terminals of the chip.

In this way, it was verified that the light emitting diodes emitted blue light.

Figure 11:
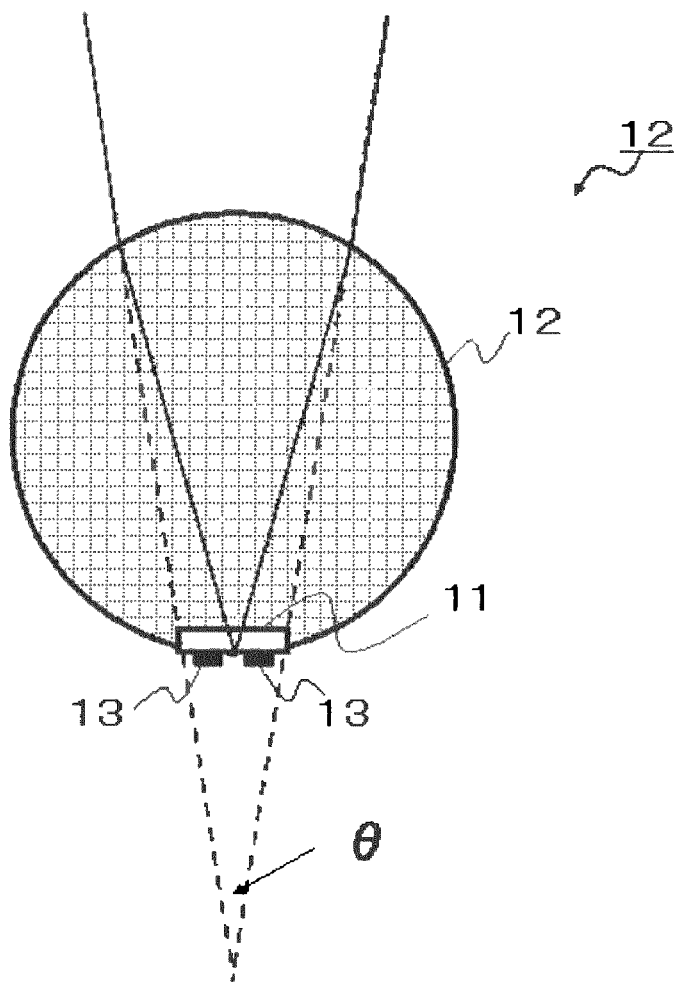
FIG. 11 is an explanatory view showing the viewing angle in an example.

It is expected that glass-sealed light emitting diode chips fabricated in this way have a luminous flux of about 2 to 3 lm. It is estimated that by using a power LED, the luminous flux is improved up to 20 lm. When computer simulation was conducted in order to see the directivity of emission light, it was verified that the viewing angle θ shown FIG. 11 ((the angle at which luminance is half the maximum luminance)×2 (open angle)) was 15 degree or below (the viewing angle was able to be set at 10° or below, depending on the refractive index of the glass material).

It was also verified that the main light emission of the light emitting diode chips had a peak wavelength of 500 nm or below.

Example 2

After cullet comprising the same material as the glass material used in Example 1 was crushed in a mortar by a pestle, a yellow phosphor material "P46-Y3" manufactured by Kasei Optonix, Ltd. having a weight of 381 mg was mixed into the crushed cullet to obtain a phosphor-containing frit. The obtained phosphor-containing glass frit was divided into parts having a weight of 34 mg, and the divided parts were heated at 610° C. for 15 minutes. The temperature-raising rate and the cooling rate were set at the same rates as those in Example 1. Thus, glass members were formed in a shape as shown in FIG. 1(a).

When light emitting diode chips and the above-mentioned glass members were put on a substrate coated with a releasing agent as in Example 1, light emitting diode chips were obtained, being sealed by glass members with phosphor dispersed therein. The turn-on voltage was 2.4 V, and white light emission was obtained.

Figure 12:
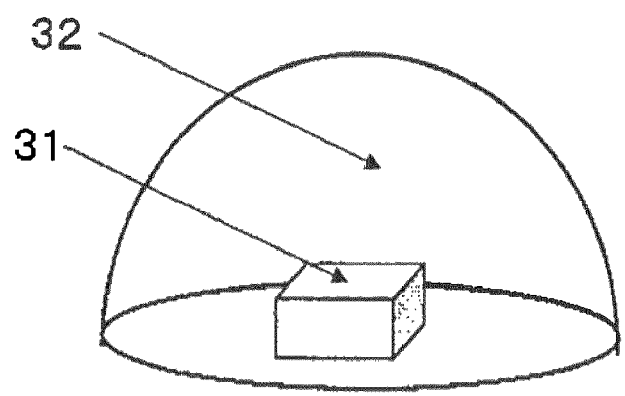
FIG. 12 is a perspective view showing the light emitting diode chip in another example of the present invention.

Blue rays, which were emitted from a light emitting diode chip, were converted into yellow rays by the phosphor in the glass member. It was verified that the yellow rays obtained by conversion and blue light emission were mixed to cause white light emission. When a phosphor-containing glass material having a radius of about 500 μm is formed in a semi-spherical shape as a first glass member, e.g., in the vicinity of a light emitting diode in the same way, a light emitting diode sealed by phosphor-containing glass is obtained as shown in FIG. 12. Reference numeral 31 designates the light emitting diode, and reference numeral 32 is the phosphor-containing glass member formed in such a semi-spherical shape.

Figure 13:
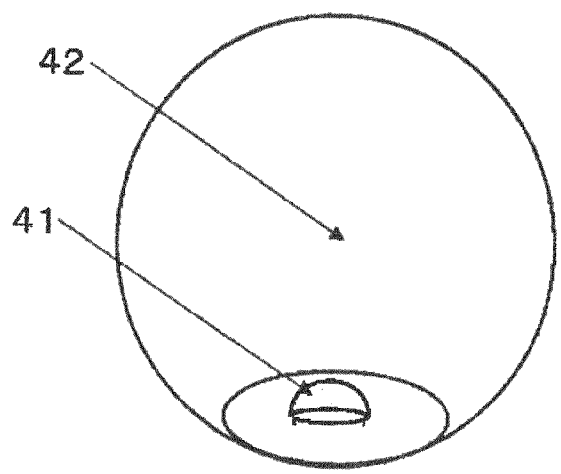
FIG. 13 is a perspective view showing the light emitting diode chip according to another example of the present invention.

It is expected that when a second glass member 12 formed in a spherical shape as shown in FIG. 1(a) is put on the phosphor-containing glass member, and when the second glass member is heated, followed by being cooled, a glass-sealed product with phosphor dispersed in the vicinity of the light emitting diode is formed as shown in FIG. 13. Reference numeral 41 designates a sealed one with the light emitting diode sealed by the first glass member formed in a semi-spherical shape, and reference numeral 42 designates the second glass member, which is put on the sealed one. In this case, since blue rays are partly converted into yellow rays in portions in the vicinity of the light emitting diode, white light emission can be caused by a combination of yellow rays and blue rays. Accordingly, it is expected that it is possible to more easily obtain an excellent directivity since the light emitting diode functions as a white light source closer to a point source. It should be noted that although the same experiment was conducted at 710° C., the phosphor-containing glass frit was discolored grey, failing to obtain a desired result.

Example 3

Figure 14:
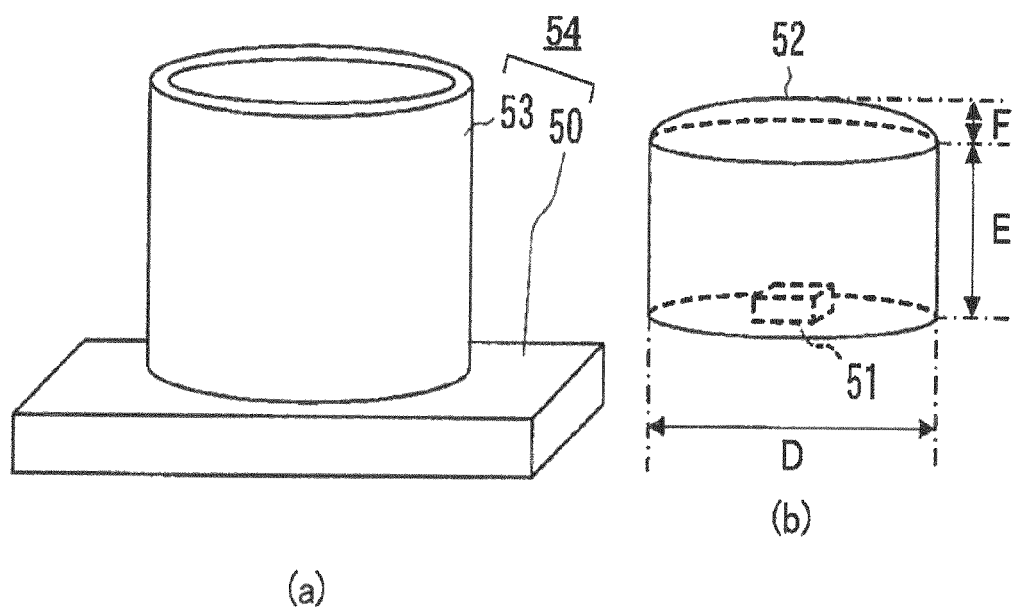
FIGS. 14(a) and (b) are a perspective view showing a pipe used for preparing a glass member in another example of the present invention and a perspective view showing the light emitting diode chip according to another example of the present invention.

Boron nitride powder was sprayed, as a releasing agent, on an inner wall of a cylindrical pipe 53, which had an inner diameter 5.5 mm, a thickness of 0.5 mm and a height of 10 mm, and which was available under the tradename of Pyrex (FIG. 14(a)), and the pipe was put on a substrate 50, which had a light emitting diode chip carried thereon and was coated with a releasing agent. After that, a glass material containing the same composition as that of Example 1 and having a weight of 381 mg, was filled in the pipe 53, was heated and was cooled along with the chip. The pipe 53 and the substrate 50 formed a jig 54 for forming a glass member. The heating condition and the cooling condition were the same those of Example 1.

After cooling, a light emitting diode chip was obtained, being sealed with glass, which had a leading portion formed in a curved shape by surface tension as shown in FIG. 14(b). Reference numeral 51 designates the light emitting diode chip, and reference numeral 52 designates the glass sealing the light emitting diode chip. The glass had a dimension D of 5.5 mm, a dimension E of 2.1 mm and a dimension F of 1.5 mm. The turn-on voltage was 2.3 V, and it was verified that blue light emission was obtained. When a glass member formed in such a shape is used, it is possible to control the directivity since the distance between the light emitting diode and the spherical surface can be changed by a combination of the volume of glass and a mold coated with a releasing agent. This mold is preferred in terms of controlling the directivity since it is easy to control the length (the total distance of E+F) of the chip-sealing glass member by adjusting the volume of the glass material introduced into the pipe 53. It should be noted that although a similar experiment was conducted, using an SUS metal pipe and the like instead of a pipe available under the trademark of Pyrex, the experiment was not completed because each glass member was unable to be taken out of the pipes and the like after cooling.

Example 4

A silicon wafer having a diameter of 6 inch (manufactured by OSAKA TITANIUM) was used as the substrate, and the substrate had a releasing agent layer formed thereon by spraying a releasing agent to such a degree that the substrate surface was completely covered with the releasing agent. As the releasing agent, boron nitride powder (available under the product name of "Boron Spray" and manufactured by KakenTech Co. Ltd.) was used. Glass pieces having different weights were put on the substrate and were subjected to heat treatment as in Example 1, each of which was formed in a substantially spherical shape as a whole and had a flat surface at a portion in contact with the releasing agent layer. The glass material for the glass pieces was the same as that of Example 1. The glass pieces were prepared having five different weights of 10 mg, 20 mg, 30 mg, 60 mg and 90 mg.

Among the light emitting diode chips dispersed on the silicon wafer having the above-mentioned releasing agent layer, ones having an electrode-forming side facing the substrate surface were selected, and the sealing glass pieces were put on the selected light emitting diode chips so as to be placed at the respective centers of the chips. The sealing glass pieces were heated, followed by being cooled, under the same conditions as the formation of the sealing glass pieces. Thus, each of the selected light emitting diode chips was obtained, being covered by the sealing glass piece and having the electrode-forming side exposed. As the light emitting diode chips, products available under the product name of E1C60-0B011-03 manufactured by Toyoda Gosei Co., Ltd. were used. The light emitting diode chips had dimension of about 0.32 mm☐ as viewed in a front view.

Besides the above-mentioned light emitting diode chip, other companies' products, which are currently commercially available, may be applied to the present invention. Examples of the other companies' products include products manufactured by Nichia Corporation, Toyoda Gosei Co., Ltd., Sharp Corporation, Showa Denko K.K., Toshiba Corporation and Cree of the U.S. In the present invention, the light emitting diode chip is not necessary formed in a substantially hexahedral shape and may be obviously formed in another shape as long as the light emitting diode chip has a structure that the light emitting portion is sealed by a glass member and that the side of the chip with the terminals thereon can be exposed outside the glass member.

Figure 15:
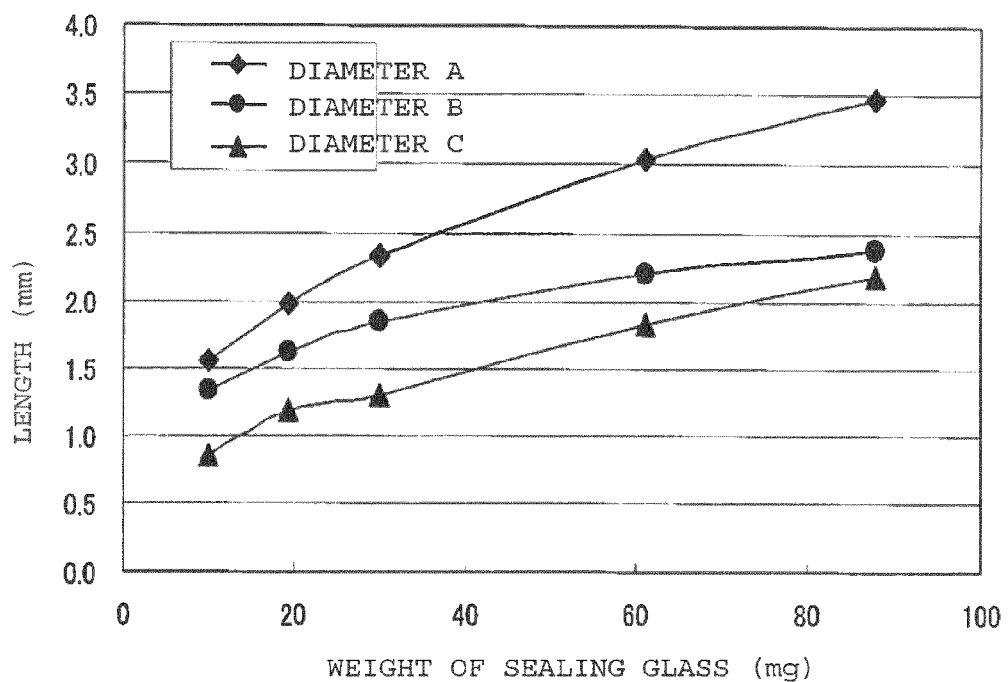
FIG. 15 is a graph showing the relationship between the weight of glass pieces and the dimensions of sealed glass (A, B and C) in an example.
Figure 16:
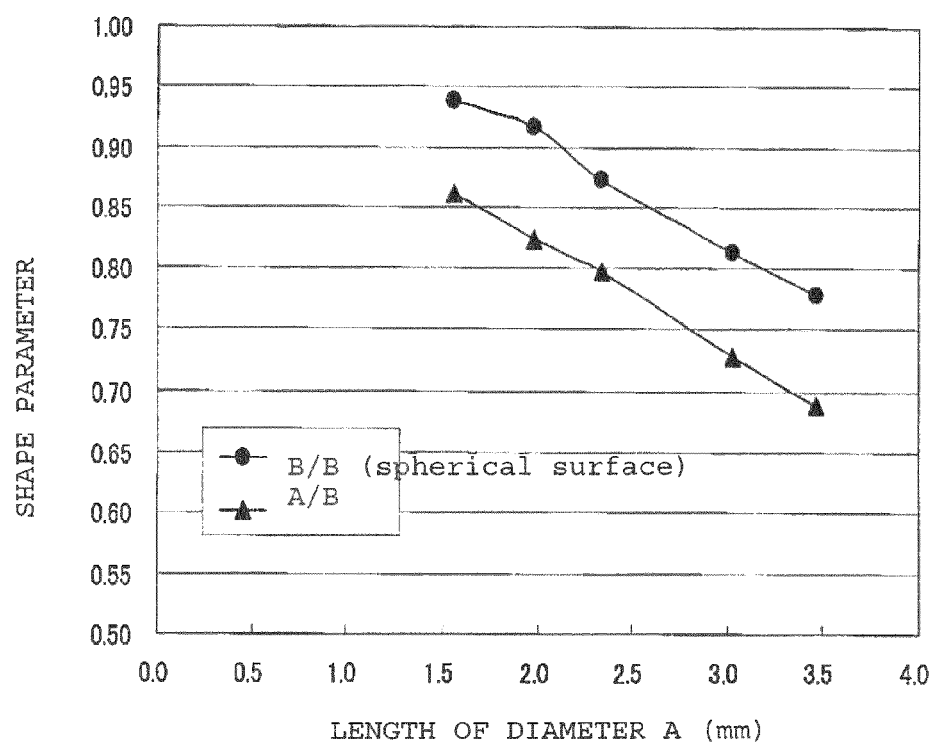
FIG. 16 is a graph showing the relationship between the dimension A and shape parameters in the example.

FIG. 15 shows a relationship between the weight of each glass pieces and the dimensions (A, B and C) of obtained sealing glass. FIG. 16 shows a relationship between shape parameters. As the shape parameters, two kinds of parameters of (A/B) and (B/B') were used. It should be noted that B' represents a diameter along the principal axis extending in the vertical direction when the sealing glass was formed in complete spherical shape.

FIG. 15 and FIG. 16 reveal that as the weight of the glass pieces decreases, the surface shape of the sealing glass is closer to a spherical surface. On the other hand, these graphs reveal that the weight of the glass pieces increases, the dimension B decreases in comparison with the dimension A to make the surface shape of the sealing glass closer to a flat and curve surface deformed from a spherical surface. This is because as the weight of the glass pieces increases, the sealing glass is more likely to be affected by gravity. The distance L that is between the center of the curved surface and the flat portion decreases as the weight of the glass pieces increases. From the viewpoint that the directivity of emission light increases not only as the surface shape of the sealing glass is closer to a spherical shape but also as the distance L increases, it is preferred that the weight of the sealing glass be 60 mg or below (in other words, the formula (C/A)≦0.6 be established) in the example of FIG. 15.

Example 5

Figure 17:
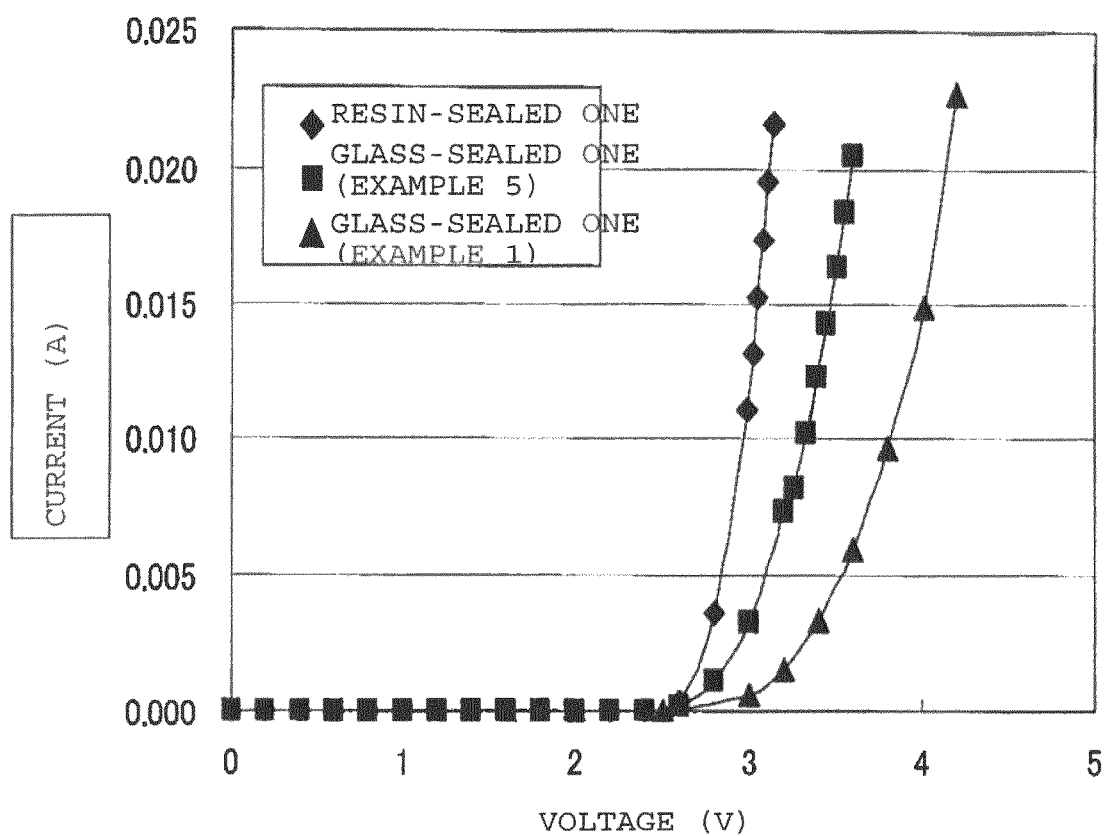
FIG. 17 is a graph showing the volt-ampere characteristic of the circuit board with a light emitting diode in an example.

A glass member was formed in a substantially spherical shape as in Example 1. The glass member was put on a light emitting diode chip (manufactured by Toyoda Gosei Co., Ltd. and available under the product name "E1C60-0B011-03"), and then the light emitting diode chip was sealed by the glass member as in Example 1. Next, a circuit board with a light emitting diode board was obtained by mounting the glass-sealed light emitting diode chip to a substrate as in Example 1. FIG. 17 shows comparison results. The phrase "RESIN SEALED ONE" in FIG. 17 means a circuit board with a light emitting diode, which was obtained by applying a resin composition (a silicon resin manufactured by Shin-Etsu Chemical Co., Ltd., available under the product name "LPS3400" and having a refractive index of 1.41), by means of potting, on a substrate with an unsealed light emitting diode chip (manufactured by Toyoda Gosei Co., Ltd. and available under the product name "E1C60-0B011-03") mounted thereon, heating the resin composition for 60 minutes, followed by heating the resin composition at 150° C. for 60 minutes.

As shown in FIG. 17, the circuit board with a light emitting diode in Example 5 increased power consumption by about 13% in comparison with the circuit board with the resin-sealed light emitting diode. The circuit board with the light emitting diode in Example 1 increased power consumption by about 31% in comparison with the circuit board with the resin-sealed light emitting diode.

Light emission from the glass-sealed light emitting diodes was confirmed in this manner. Since the turn-on voltage of the glass-sealed light emitting diodes had the same values as the light emitting diodes before glass sealing, it is supposed that the LED light emitting layer of each of the light emitting diodes was not damaged by the heat applied during sealing.

It is supposed that the reason why the power consumption of the glass-sealed light emitting diodes increased is that the heat applied during glass sealing provided the electrodes of each of the LEDs with a thermal history to slightly change the electrical conduction characteristics of the electrode portions. However, it is supposed that such a degree of change causes no problem in terms of the practical performance of a light emitting device. In the field of semiconductor devices, such as a LED, there has been known an electrode structure having a heat resistance. It is expected to restrain a change in the above-mentioned electrical conductive characteristic if a LED, which includes a layer structure made of a specific material, and which has been disclosed in, e.g., JP-A-2002-151737, JP-A-10-303407 and JP-A-2005-136415, is applied to the present invention.

Figure 19:
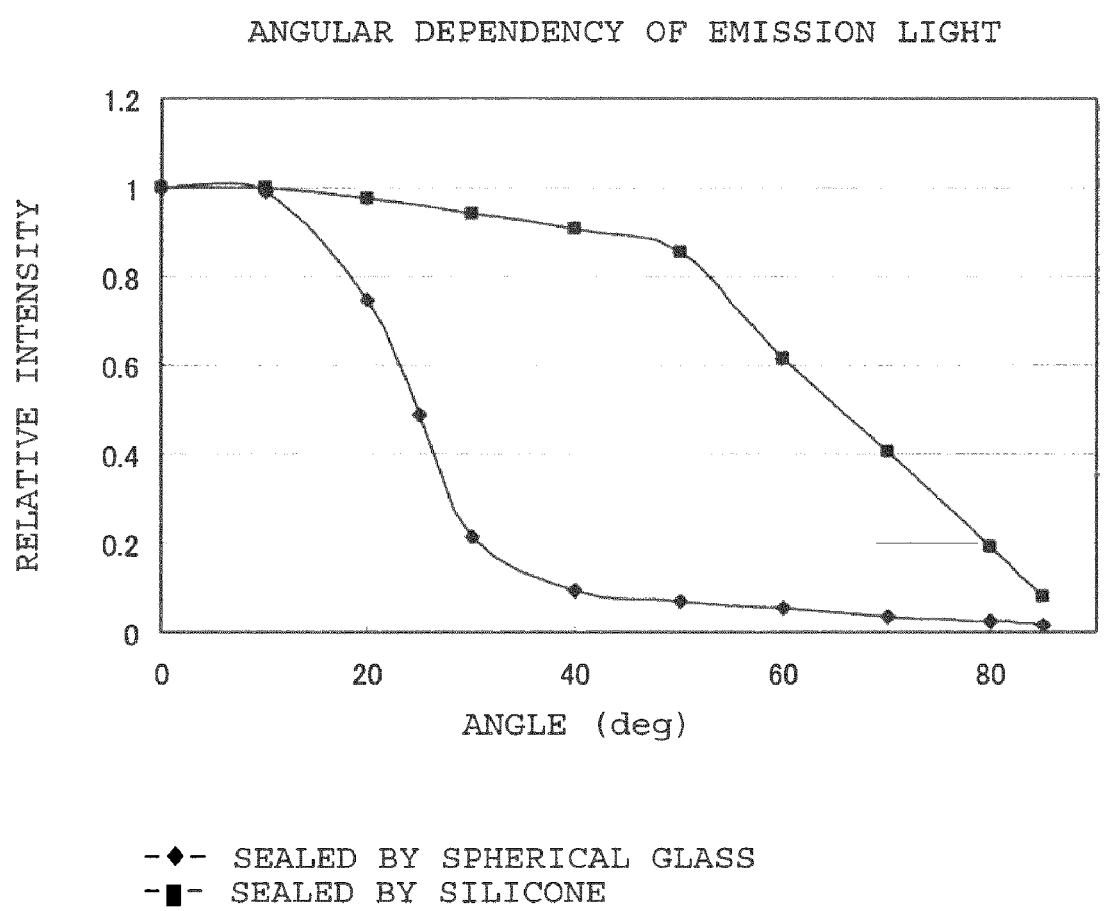
FIG. 19 is a graph showing the angular dependency of emission light in the present invention and prior art.
Figure 20:
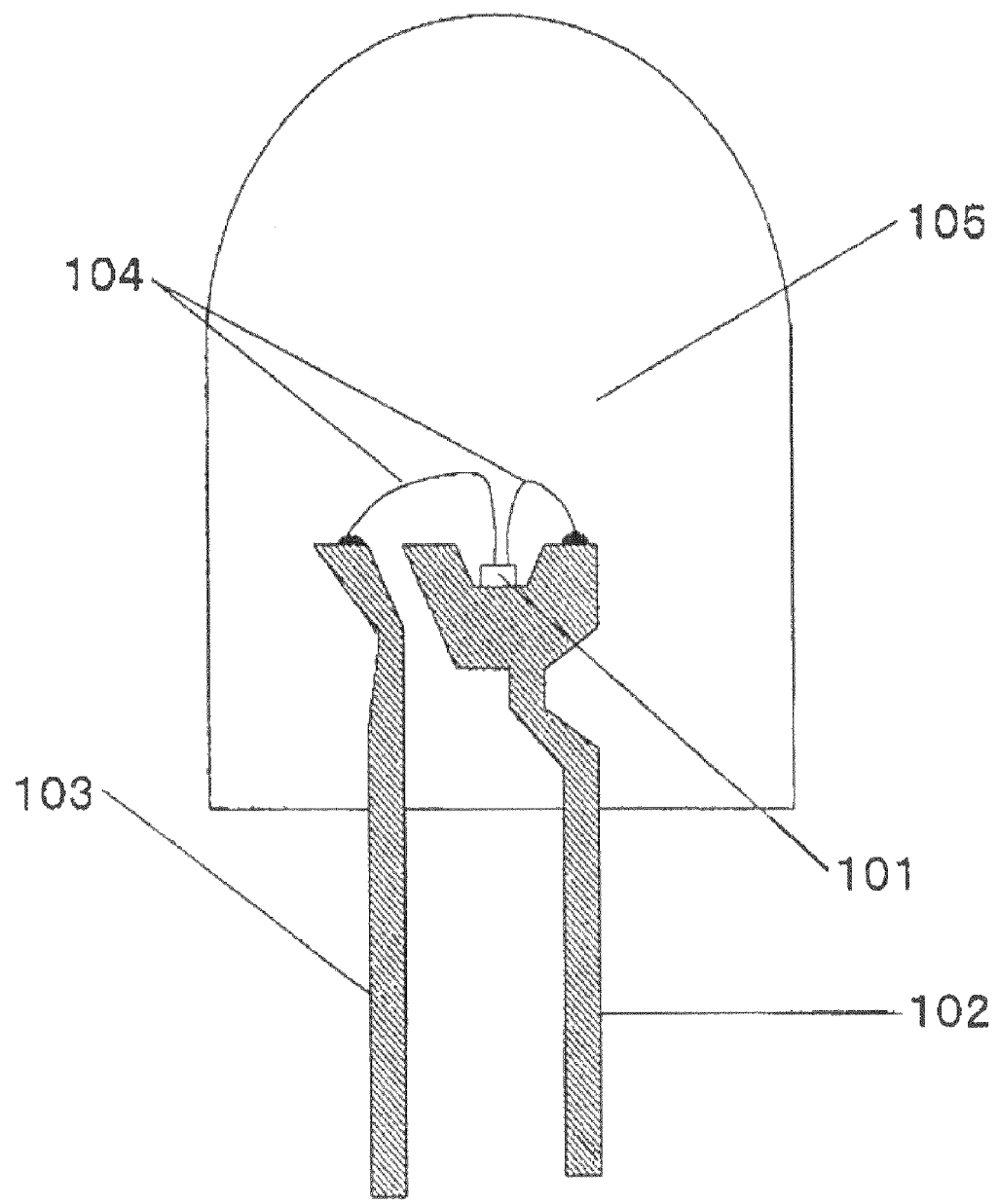
FIG. 20 is a cross-sectional view of a conventional LED lamp.
Figure 21:
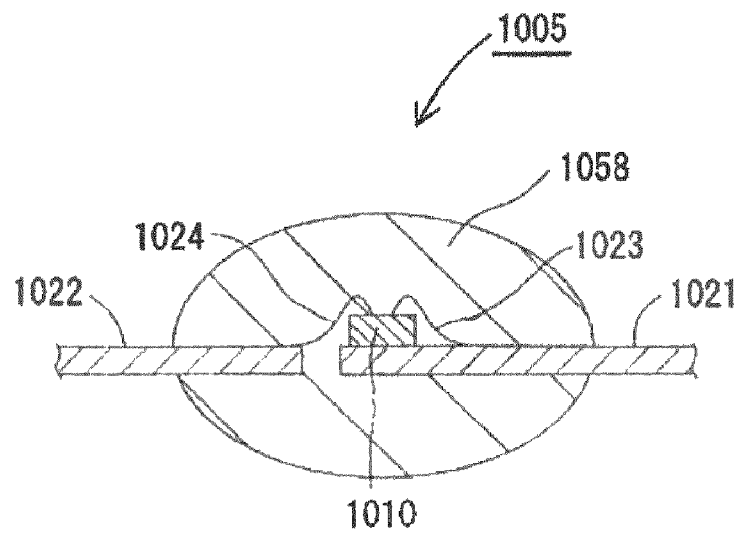
FIG. 21 is a cross-sectional view showing another conventional one.
Figure 22:
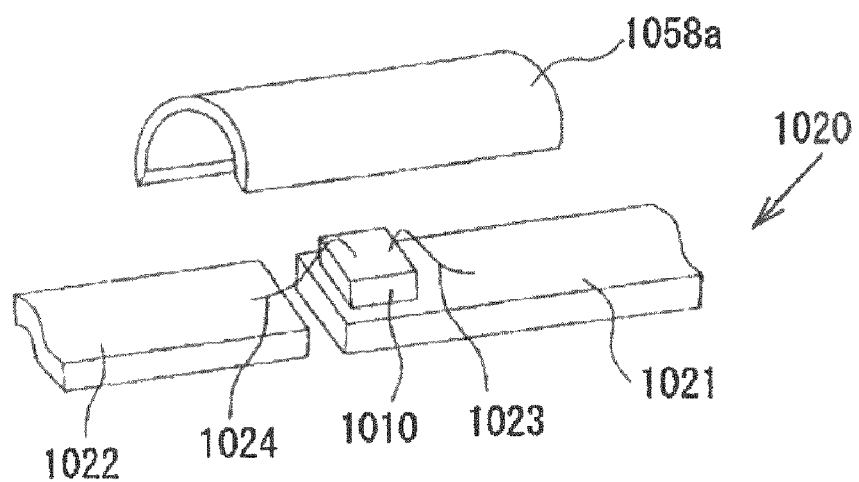
FIG. 22 is a perspective view showing an intermediate step in a conventional fabrication process.

A glass-sealed light emitting element according to the present invention and a conventional resin-sealed light emitting element were measured in terms of the angular dependency of emission light, and the measurement results are shown in FIG. 19. In the present invention, it was revealed that the emission light had a strong relative intensity in the vicinity of angles from 0 to 10°, which meant that the emission light converged in a central portion.

The glass-sealed diode chip according to the present invention exhibited a clear directivity in comparison with LEDs inherently emitting light having no directivity (see the characteristic curve of the resin-sealed product, which shows an emission light characteristic in an almost flat shape and that the emission light of the diode chip has almost no directivity). Although even a conventional resin-sealed LED can be theoretically provided with a directivity by forming the light emitting side in a lens shape, it is difficult to obtain a practically useful directivity by a resin material having a desired size since the resin has a small refractive index.

The circuit board with the light emitting diode in Example 5 was left at 80° C. for 1,000 hours, having a current of 20 mA flowing therein, as it was. It was confirmed that the light emitting diode continuously emitted light, having maintaining the shape even after that.

Example 6

The circuit board with the light emitting diode obtained in Example 5 was measured in terms of luminous flux at a rated current of 20 mA. The measured luminous flux was compared to those of an unsealed one and a resin-sealed one. The comparison results are shown in Table 1. The "unsealed one" means a circuit board with a light emitting diode, which was obtained by mounting an unsealed light emitting diode chip (manufactured by Toyoda Gosei Co., Ltd. and available under the product name of E1C60-0B011-03) to a substrate. The "resin-sealed one" means a circuit board with a light emitting diode, which was obtained by applying a resin composition (a silicone resin manufactured by Shin-Etsu Chemical Co., Ltd. available under the product name of LPS3400 and having a refractive index of 1.41), by means of potting, on a circuit board with an unsealed light emitting diode, and heating the resin composition at 100° C. for 60 minutes, followed by heating the resin composition at 150° C. for 60 minutes. The circuit board with the glass-sealed light emitting diode according to the present invention had a higher luminous flux than the circuit board with the resin-sealed light emitting diode by about 15%.

TABLE 1

|  | Luminous flux (relative value) |
| --- | --- |
| Glass-sealed one (present invention) | 1.36 |
| Unsealed one | 1.00 |
| Resin-sealed one | 1.18 |

The present invention, which has been described above, may be applied to various kinds of applications, such as a LED display, a backlight source, a light source to be mounted on a vehicle, a traffic signal, an optical sensor, an indicator and a fishing light, a light emitting diode used for, e.g., a headlight, a winker and an idiot light for automobiles, and an optical pickup.

The entire disclosures of Japanese Patent Application No. 2005-118415 filed on Apr. 15, 2005 and Japanese Patent Application No. 2005-322943 filed on Nov. 7, 2005 including specifications, claims, drawings and summaries are incorporated herein by reference in their entireties.

What is claimed is:

1. A glass-sealed light emitting element, comprising:
a light emitting element including a terminal-side surface having electrical terminals on the terminal side surface, and a backside surface opposed to the terminal side surface and configured to emit light from the backside surface; and
a glass member sealing the light emitting element, the glass member including upper and lower regions defined by a principal axis extending along a longest horizontal direction with respect to the terminal-side surface of the light emitting element, the upper region formed by a continuous curved surface, and the lower region formed by the continuous curved surface of the upper region extending into at least a portion of the lower region, wherein the backside surface is at least partially sealed by the glass member and the terminal-side surface is at least partially exposed from the glass member, wherein:
the principal axis extending in the horizontal direction with respect to the terminal side surface of the light emitting element has a diameter A,
the glass member further comprising a principal axis extending along a longest vertical direction with respect to the terminal-side surface of the light emitting element and having a diameter B, and a portion of the lower-region, other than said continuous curved surface extending into the lower region, and having a diameter C, and
the diameters A, B and C satisfy the expression A>B>C.

2. The glass-sealed light emitting element according to claim 1, wherein:
the lower region of the glass member contains a flat portion; and
the light emitting element is disposed on the flat portion.

3. The glass-sealed light emitting element according to claim 1, wherein the diameters A and C satisfy the expression (C/A)<0.6.

4. The glass-sealed light emitting element according to claim 1, wherein:
the light emitting element comprises a semiconductor chip formed in a rectangular shape as viewed in a front view; and
a portion of the upper region of the glass member has a radius of curvature having a length at least 2.5 times a length of one side of the semiconductor chip.

5. The glass-sealed light emitting element according to claim 1, wherein the curved surface of the upper region is a portion of a spherical surface or a spheroidal surface.

6. The glass-sealed light emitting element according to claim 1, wherein the light emitting element comprises a LED or a semiconductor laser.

7. The glass-sealed light emitting element according to claim 1, wherein the glass member contains $TeO_2$, $B_2O_3$ and $ZnO$.

8. The glass-sealed light emitting element according to claim 1, wherein:
the light emitting element includes a semiconductor substrate having a thermal expansion coefficient $\alpha 1$;
the glass member has a thermal expansion coefficient $\alpha 2$; and
the thermal expansion coefficient $\alpha 1$ and the thermal expansion coefficient $\alpha 2$ satisfy the expression $|\alpha 1 - \alpha 2| < 15 \times 10^{-7} (° C.^{-1})$.

9. The glass-sealed light emitting element according to claim 1, wherein the glass member has a refractive index of 1.7 or above.

10. A circuit board, comprising:
the glass-sealed light emitting element defined in claim 1; and
a substrate electrically connected to terminals of the glass-sealed light emitting element.

11. A glass-sealed light emitting element, comprising:
a light emitting element having electrical terminals on the terminal side surface, and a backside surface opposed to the terminal side surface and configured to emit light from the backside surface; and a glass member sealing the light emitting element, the glass member comprising a spherical surface portion and a flat surface portion, wherein the glass member has as a longest line segment in a horizontal direction having a first diameter, has a longest line segment in a vertical direction having a second diameter being shorter than the first diameter, and the flat surface portion has a longest line segment having a third diameter which is shorter than the second diameter, wherein the backside surface is sealed by the glass member and the terminal-side surface is at least partially exposed from the glass member.

12. The glass-sealed light emitting element according to claim 11, wherein:

the light emitting element includes a terminal-side surface; and the terminal-side surface is at least partially exposed from the flat surface portion of the glass member.

13. The glass-sealed light emitting element according to claim 11, wherein:

the horizontal direction extends substantially parallel to a top surface of the light emitting element; and the vertical direction extends substantially perpendicular to the top surface of the light emitting element.

\* \* \* \* \*